(12) United States Patent  
Asami et al.

(10) Patent No.: US 10,719,396 B2  
(45) Date of Patent: Jul. 21, 2020

(54) MEMORY SYSTEM

(71) Applicant: Toshiba Memory Corporation, Minato-ku (JP)

(72) Inventors: Shohei Asami, Fujisawa (JP); Yoshihisa Kojima, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/268,727

(22) Filed: Feb. 6, 2019

(65) Prior Publication Data

US 2019/0286518 A1 Sep. 19, 2019

(30) Foreign Application Priority Data

Mar. 19, 2018 (JP) .................................. 2018-051328

(51) Int. Cl.
*G06F 11/10* (2006.01)
*G11C 29/52* (2006.01)
*G11C 29/42* (2006.01)
*G11C 29/04* (2006.01)

(52) U.S. Cl.
CPC ...... *G06F 11/1068* (2013.01); *G06F 11/1048* (2013.01); *G11C 29/42* (2013.01); *G11C 29/52* (2013.01); *G11C 2029/0411* (2013.01)

(58) Field of Classification Search
CPC .. G06F 11/1068; G06F 11/1048; G11C 29/42; G11C 29/52; G11C 2029/0411
See application file for complete search history.

(56) References Cited

U.S. PATENT DOCUMENTS

| 7,558,109 | B2 * | 7/2009 | Brandman | .......... G06F 11/1072 365/185.03 |
| 8,839,073 | B2 | 9/2014 | Cohen | |
| 9,430,154 | B2 | 8/2016 | Cohen | |
| 10,453,537 | B1 * | 10/2019 | Reuter | ................. G11C 29/028 |
| 2006/0291322 | A1 * | 12/2006 | Crippa | ..................... G11C 7/04 365/230.06 |

(Continued)

FOREIGN PATENT DOCUMENTS

| JP | 2010-181990 | 8/2010 |
| JP | 2015-520907 | 7/2015 |
| WO | WO 2012/172645 A1 | 12/2012 |

OTHER PUBLICATIONS

Cai, Y., et al., "Error Characterization, Mitigation, and Recovery in Flash-Memory-Based Solid-State Drives", Proceedings of the IEEE, vol. 105, Issue: 9, Date of Publication: Aug. 18, 2017, pp. 1666-1704. (Year: 2017).*

*Primary Examiner* — Kyle Vallecillo
(74) *Attorney, Agent, or Firm* — Oblon, McClelland, Maier & Neustadt, L.L.P.

(57) ABSTRACT

A controller executes a plurality of first read operations and, when receiving a read request from a host, executes a second read operation. The first read operations are executed using, as determination voltage, different candidate values among a plurality of candidate values. In each of the first read operations, the controller executes error correction to acquired data, and acquires a first candidate value on the basis of results of the error corrections in the first read operations. The second read operation is executed using, as the determination voltage, a second candidate value that is ranked higher than the first candidate value.

18 Claims, 22 Drawing Sheets

(56) References Cited

U.S. PATENT DOCUMENTS

| | | | |
|---|---|---|---|
| 2008/0123419 A1* | 5/2008 | Brandman | G06F 11/1072 365/185.09 |
| 2008/0123420 A1* | 5/2008 | Brandman | G06F 11/1072 365/185.09 |
| 2008/0263265 A1* | 10/2008 | Litsyn | G11C 11/5628 711/103 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |
| 2011/0284946 A1 | 11/2011 | Kiyotoshi | |
| 2012/0069663 A1 | 3/2012 | Itagaki et al. | |
| 2012/0307557 A1 | 12/2012 | Itagaki | |
| 2014/0040680 A1 | 2/2014 | Takaku et al. | |
| 2014/0059396 A1* | 2/2014 | Matsuyama | G06F 11/0751 714/54 |
| 2014/0365836 A1* | 12/2014 | Jeon | G11C 16/26 714/721 |
| 2016/0266970 A1* | 9/2016 | Amaki | G11C 16/26 |
| 2016/0350179 A1* | 12/2016 | Lin | G11C 29/52 |
| 2016/0357631 A1 | 12/2016 | Cohen | |
| 2017/0263312 A1* | 9/2017 | Sakurada | G11C 11/5642 |
| 2017/0308438 A1* | 10/2017 | Yim | G06F 11/1402 |
| 2019/0080751 A1* | 3/2019 | Zhang | G11C 11/5642 |
| 2019/0147964 A1* | 5/2019 | Yun | G11C 16/349 365/185.22 |
| 2019/0198096 A1* | 6/2019 | Mirichigni | G11C 13/0004 |

\* cited by examiner

FIG.7

| INDEX | SHIFT AMOUNT A | SHIFT AMOUNT B | SHIFT AMOUNT C | SHIFT AMOUNT D | SHIFT AMOUNT E | SHIFT AMOUNT F | SHIFT AMOUNT G |
|---|---|---|---|---|---|---|---|
| 0 | | | | | | | |
| 1 | | | | | | | |
| 2 | | | | | | | |
| ... | | | | | | | |
| I_last | | | | | | | |

|        | PATTERN 0  | PATTERN 1  | PATTERN 2  | PATTERN 3  |
|--------|------------|------------|------------|------------|
| PAGE 0 | SUCCEEDED  | SUCCEEDED  | FAILED     | FAILED     |
| PAGE 1 | FAILED     | SUCCEEDED  | SUCCEEDED  | FAILED     |
| PAGE 2 | FAILED     | FAILED     | SUCCEEDED  | SUCCEEDED  |
| PAGE 3 | SUCCEEDED  | SUCCEEDED  | FAILED     | FAILED     |

| MANAGEMENT UNIT AREA | LEARNED VALUE (SHIFT PATTERN) |
|---|---|
| 0 | 3 |
| 1 | 1 |
| 2 | 2 |
| 3 | 2 |
| ⋮ | ⋮ |

221

MEMORY SYSTEM

CROSS-REFERENCE TO RELATED APPLICATIONS

This application is based upon and claims the benefit of priority from Japanese Patent Application No. 2018-051328, filed on Mar. 19, 2018; the entire contents of which are incorporated herein by reference.

FIELD

Embodiments described herein generally relate to a memory system.

BACKGROUND

Conventionally, a memory system including a memory cell transistor is known. Such a memory system determines data held in the memory cell transistor in a read operation on the basis of a comparison between a threshold voltage of the memory cell transistor and a determination voltage.

However, the threshold voltage of the memory cell transistor might vary depending on various factors. Meanwhile, the memory system is configured to be able to change the value of the determination voltage. In the case of occurrence of erroneous data determination in a read operation, the memory system may change the value of the determination voltage for retrying the read operation. The erroneous data determination and the retry of the read operation might be a factor of deteriorating read latency.

BRIEF DESCRIPTION OF THE DRAWINGS

FIG. 7 is a diagram illustrating an example of the data structure of a shift index table in the first embodiment;

FIG. 8 is a diagram for explaining an overview of a method for determining a learned value of a controller in the first embodiment;

DETAILED DESCRIPTION

In general, according to one embodiment, a memory system is connectable to a host. The memory system includes a first memory, a controller, and a second memory. The first memory is nonvolatile and includes a memory cell transistor configured to have a threshold voltage to be controlled. The controller is configured to execute a read operation to the first memory to acquire, from the first memory, data corresponding to the threshold voltage on the basis of a comparison between the threshold voltage and a determination voltage. The second memory is configured to store determination-voltage information including a plurality of candidate values. Each of the candidate values is ranked corresponding to a degree of variation in the threshold voltage. The controller is configured to execute a plurality of first read operations to the first memory. The plurality of first read operations are read operations that are executed using, as the determination voltage, different candidate values among the plurality of candidate values. The controller is configured to execute error correction to acquired data in each of the first read operations. The controller is configured to acquire a first candidate value on the basis of results of the error correction in the first read operations. The controller is configured to, upon receiving a read request from the host, execute a second read operation. The second read operation is a read operation that is executed using, as the determination voltage, a second candidate value that is ranked higher than the first candidate value.

Exemplary embodiments of the memory system will be explained below in detail with reference to the accompanying drawings. The following embodiments are merely exemplary and not intended to limit the scope of the present invention.

First Embodiment

Figure 1:
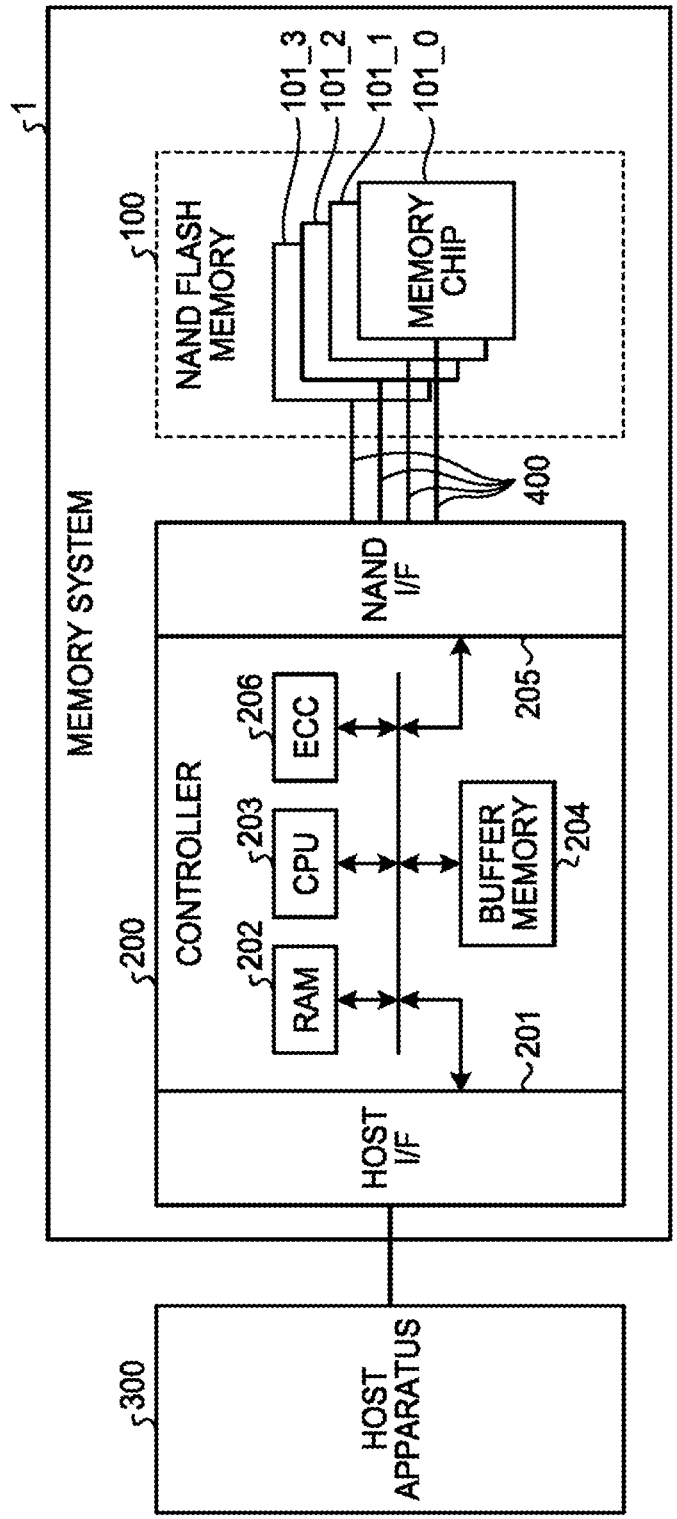
FIG. 1 is a diagram illustrating an example of the configuration of a memory system of a first embodiment.

FIG. 1 is a diagram illustrating an example of the configuration of a memory system of a first embodiment. As illustrated in FIG. 1, the memory system 1 is connectable to a host apparatus 300. The host apparatus 300 is, for example, a server, a personal computer, or a mobile information processor. The memory system 1 functions as external storage of the host apparatus 300. The host apparatus 300 can issue requests to the memory system 1. The requests include a read request and a write request.

The memory system 1 includes a NAND flash memory 100 including one or more memory chips 101, and a controller 200. Herein, the memory system 1 includes four memory chips 101_0, 101_1, 101_2, and 101_3. The number of memory chips 101 in the memory system 1 is not limited to four.

Each memory chip 101 includes a plurality of memory cell transistors, and can store data in a nonvolatile manner. The memory chips 101 are connected to the controller 200 via a NAND bus 400.

Figure 2:
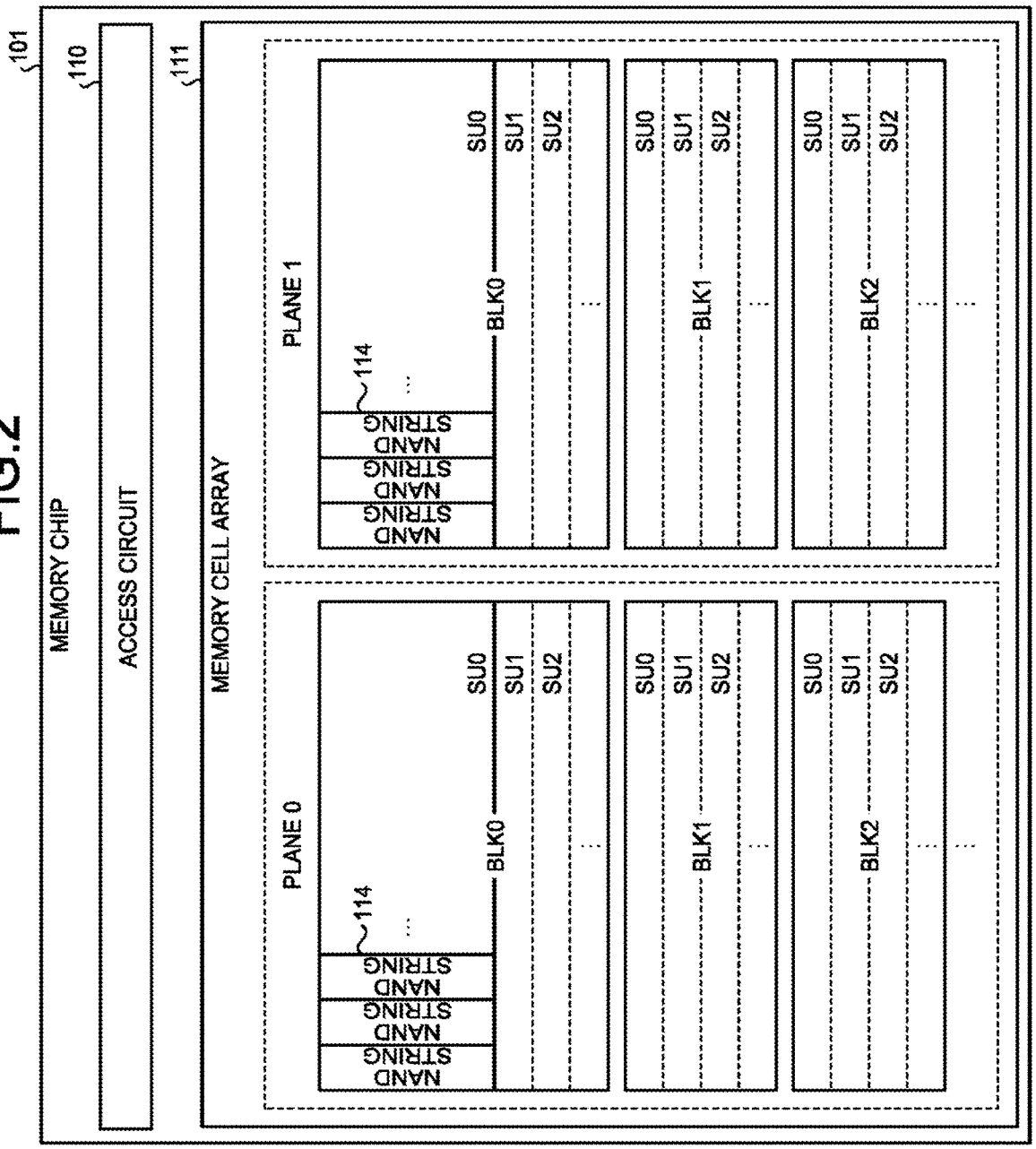
FIG. 2 is a diagram illustrating an example of the configuration of a memory chip of the first embodiment.

FIG. 2 is a diagram illustrating an example of the configuration of the memory chip 101. As illustrated in FIG. 2, the memory chips 101 each include an access circuit 110 and a memory cell array 111.

The memory cell array 111 is divided into a plurality of planes (e.g., plane 0 and plane 1). Both planes are subarrays that can be accessed in parallel. Each plane includes a plurality of blocks BLKs (BLK0, BLK1, . . . ) each of which is a set of nonvolatile memory cell transistors. Each block BLK includes a plurality of string units SU (SU0, SU1, . . . ) each of which is a set of memory cell transistors associated with word lines and bit lines. Each string unit SU includes a plurality of NAND strings 114 including memory cell transistors connected in series. The number of NAND strings 114 in the string unit SU is arbitrary. The number of planes in the memory cell array 111 freely determined not limited to two. Moreover, the memory cell array 111 is not necessarily divided.

The access circuit 110 includes, for example, a row decoder, a column decoder, a sense amplifier, a latch circuit, and a voltage generator circuit. The access circuit 110 executes a program operation, a read operation, and an erase operation to the memory cell array 111 of each plane in response to a command from the controller 200.

Figure 3:
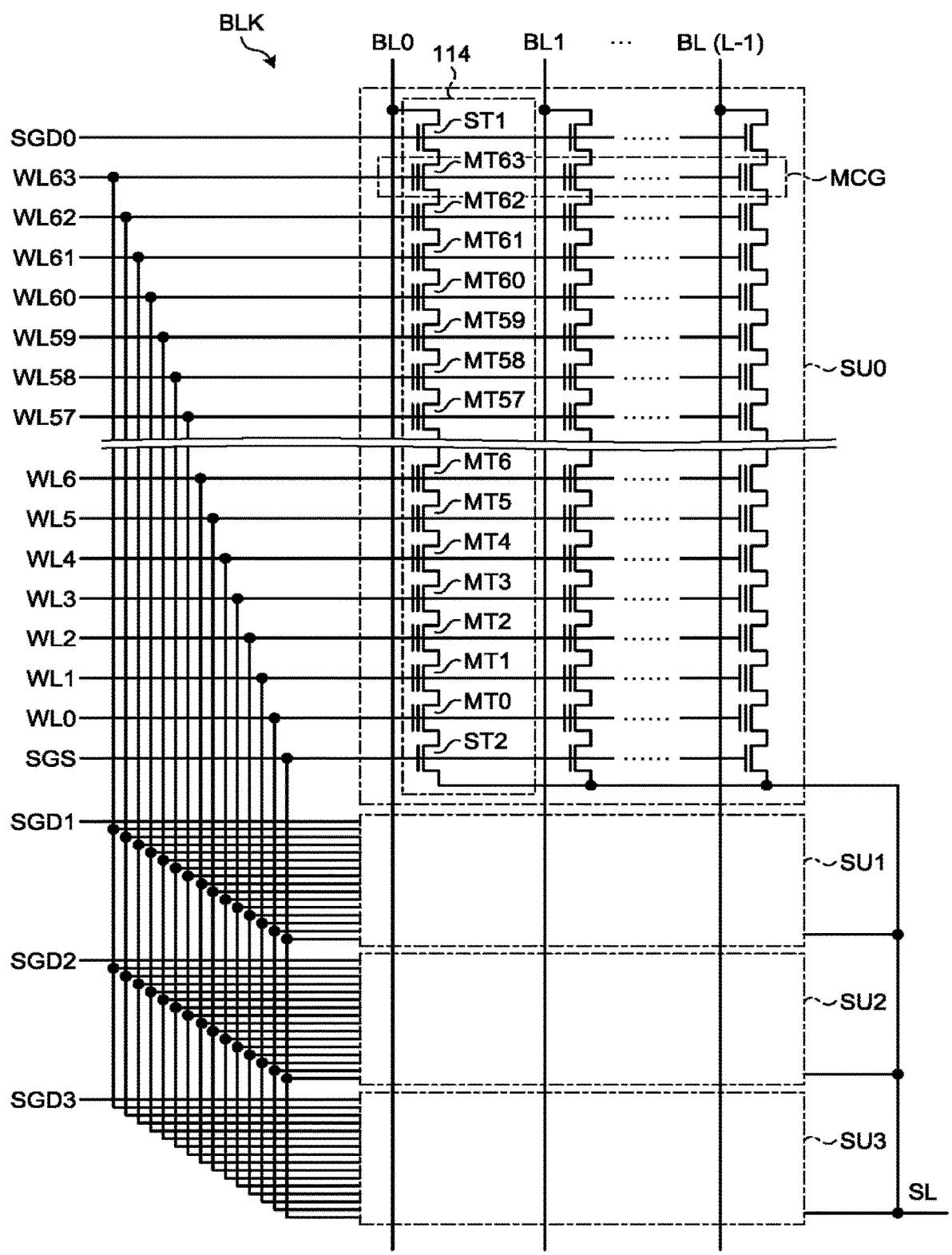
FIG. 3 is a diagram illustrating the circuit configuration of a block BLK of the first embodiment.

FIG. 3 is a diagram illustrating the circuit configuration of the block BLK of the first embodiment. The blocks BLKs have the same configuration. The blocks BLKs each include, for example, four string units SU0 to SU3. Each string unit SU includes the NAND strings 114.

Each of the NAND strings 114 includes, for example, 64 memory cell transistors MT (MT0 to MT63) and selective transistors ST1 and ST2. The memory cell transistors MT each include a control gate and a charge storage layer, and hold data in a nonvolatile manner. The 64 memory cell transistors MT (MT0 to MT63) are connected in series between the source of the selective transistor ST1 and the drain of the selective transistor ST2. The memory cell transistors MT may be a MONOS type that includes an insulating film for the charge storage layer, or an FG type that includes a conductive film for the charge storage layer. The number of memory cell transistors MT in the NAND string 114 is not limited to 64.

The gates of the selective transistors ST1 in the string units SU0 to SU3 are connected to selective gate lines SGD0 to SGD3, respectively. In contrast, the gates of the selective transistors ST2 in the string units SU0 to SU3 are connected in common to, for example, a selective gate line SGS. The gates of the selective transistors ST2 may be connected to different selective gate lines SGS0 to SGS3 in the string units SU0 to SU3. The control gates of the memory cell transistors MT0 to MT63 in the same block BLK are connected in common to the word lines WL0 to WL63, respectively.

The drains of the selective transistors ST1 in the NAND strings 114 in the string unit SU are connected to different bit lines BL (BL0 to BL(L−1) where L is a natural number equal to or greater than two), respectively. The bit lines BL connect one NAND string 114 in each string unit SU in the blocks BLKs in common. Furthermore, the sources of the selective transistors ST2 are connected in common to a source line SL.

In other words, the string unit SU is a set of the NAND strings 114 connected to different bit lines BL and the same selective gate line SGD. The block BLK is a set of the string units SU connected to the same word line WL. The memory cell array 111 is a set of the blocks BLKs connected to the same bit line BL.

The access circuit 110 collectively performs a program operation and a read operation to the memory cell transistors MT connected to one word line WL in one string unit SU in each plane. Hereinafter, a group of memory cell transistors MT collectively selected in the program operation and the read operation to each plane will be referred to as a "memory cell group MCG". A set of one-bit data to be programmed to or read from one memory cell group MCG will be referred to as a "page".

The access circuit 110 can perform an erase operation to each plane in units of blocks BLKs or in units smaller than the blocks BLKs. An erase method is described in, for example, "NONVOLATILE SEMICONDUCTOR MEMORY DEVICE", U.S. patent application Ser. No. 13/235,389, filed Sep. 18, 2011 and in "NON-VOLATILE SEMICONDUCTOR STORAGE DEVICE", U.S. patent application Ser. No. 12/694,690, filed Jan. 27, 2010. An erase method is also described in "NONVOLATILE SEMICONDUCTOR MEMORY DEVICE AND DATA ERASE METHOD THEREOF", U.S. patent application Ser. No. 13/483,610, filed May 30, 2012. The entire contents of these patent applications are incorporated by reference in the specification of the present application.

One logical page may include two or more pages in different planes or different memory chips 101. The controller 200 may execute the program operation or the read operation in parallel to the pages of the logical page. Alternatively, one logical block may include two or more blocks BLKs in different planes or different memory chips 101. The controller 200 may execute the erase operation in parallel to the blocks BLKs of the logical block.

Figure 4:
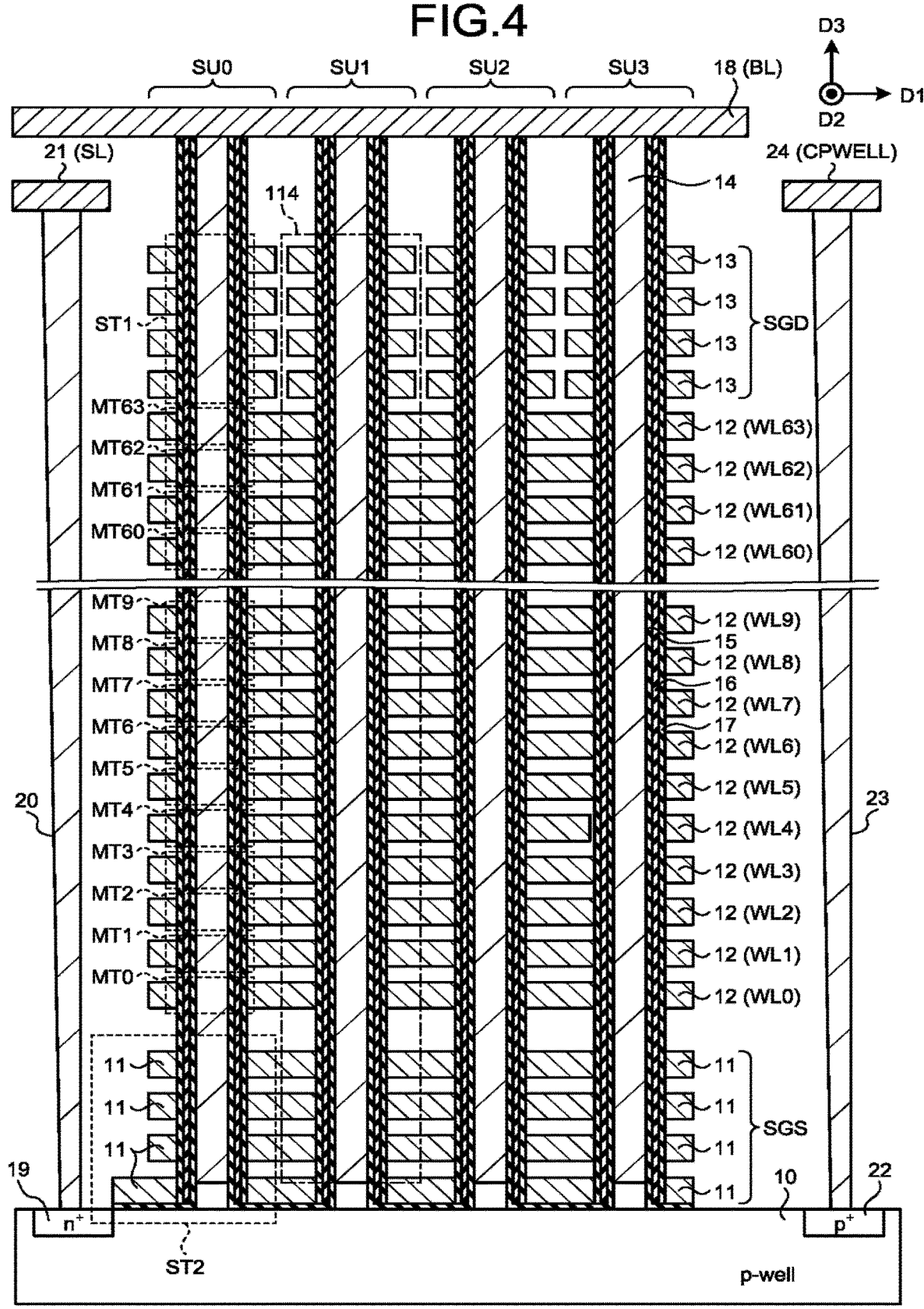
FIG. 4 is a cross-sectional view of a partial area of the block BLK of the first embodiment.

FIG. 4 is a cross-sectional view of a partial area of the block BLK of the first embodiment. As illustrated in the figure, the NAND strings 114 are formed on a p-well region 10. In other words, for example, four wiring layers 11 functioning as the selective gate line SGS, 64 wiring layers 12 functioning as the word lines WL0 to WL63, and four wiring layers 13 functioning as the selective gate lines SGD are sequentially stacked on the well region 10. A not-shown insulating film is formed between the stacked wiring layers.

A pillar-shaped conductor 14 penetrates these wiring layers 13, 12, and 11 to the well region 10. A gate insulating film 15, a charge storage layer (insulating film or conductive film) 16, and a block insulating film 17 are sequentially formed on a side surface of the conductor 14, all of which form the memory cell transistors MT and the selective transistors ST1 and ST2. The conductor 14 functions as a current path of the NAND string 114, and is a region where a channel of each transistor is formed. The conductor 14 is connected at the top end to a metal wiring layer 18 functioning as the bit line BL.

An n+ impurity diffusion layer 19 is formed on a surface area of the well region 10. The diffusion layer 19 is provided with a contact plug 20 thereon connected to a metal wiring layer 21 functioning as the source line SL. A p+ impurity diffusion layer 22 is further formed on a surface area of the well region 10. The diffusion layer 22 is provided with a contact plug 23 thereon. The contact plug 23 is connected to a metal wiring layer 24 functioning as a well wiring CPWELL. The well wiring CPWELL is for applying a potential to the conductor 14 via the well region 10.

The above configurations are arrayed on a semiconductor substrate in a second direction D2 parallel to the substrate, and the sets of the NAND strings 114 are aligned in the second direction D2, forming the string units SU.

The memory cell array 111 may have a configuration other than the above configuration. That is, the configuration of the memory cell array 111 is described in, for example, "THREE DIMENSIONAL STACKED NONVOLATILE SEMICONDUCTOR MEMORY", U.S. patent application Ser. No. 12/407,403, filed Mar. 19, 2009; in "THREE DIMENSIONAL STACKED NONVOLATILE SEMICONDUCTOR MEMORY", U.S. patent application Ser. No. 12/406,524, filed Mar. 18, 2009; "NON-VOLATILE SEMICONDUCTOR STORAGE DEVICE AND METHOD OF MANUFACTURING THE SAME", U.S. patent application Ser. No. 12/679,991, filed Dec. 9, 2008; and "SEMICONDUCTOR MEMORY AND METHOD FOR MANUFACTURING SAME", U.S. patent application Ser. No. 12/532,030, filed Mar. 23, 2009. The entire contents of these patent applications are incorporated by reference in the specification of the present application.

Hereinafter, the memory cell transistor MT will be simply referred to as memory cell.

Figure 5:
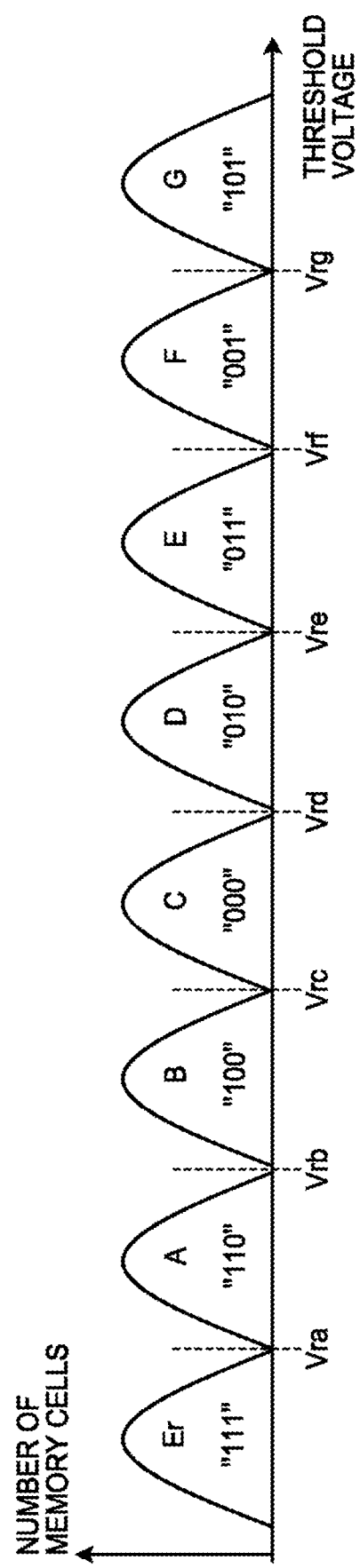
FIG. 5 is a diagram illustrating an example of a possible threshold voltage of a memory cell of the first embodiment.

FIG. 5 is a diagram illustrating an example of a possible threshold voltage of the memory cell of the first embodiment. The vertical axis indicates the number of memory cells, and the horizontal axis indicates the threshold voltage. In other words, FIG. 5 illustrates memory cell distributions with respect to the threshold voltage. In the following, the embodiment will describe an example of the memory cell which can hold eight-valued data. However, the number of values of data to be held is not limited to eight. In the embodiment, the memory cell needs to be capable of holding two or more-valued data (i.e., data of one or more bits).

As illustrated in FIG. 5, the possible threshold-voltage range is divided into eight sections. The eight sections are referred to as state "Er", state "A", state "B", state "C", state "D", state "E", state "F", and state "G", in order from the lowest threshold voltage. The access circuit 110 controls the threshold voltage of each memory cell to any of state "Er", state "A", state "B", state "C", state "D", state "E", state "F", and state "G". As a result, in plotting the number of memory cells with respect to the threshold voltage, the memory cells ideally form eight non-overlapping distributions in different states, as illustrated in FIG. 5.

The eight states correspond to three-bit data. According to the example of FIG. 5, state "Er" corresponds to "111", state "A" corresponds to "110", state "B" corresponds to "100", state "C" corresponds to "000", state "D" corresponds to "010", state "E" corresponds to "011", state "F" corresponds to "001", and state "G" corresponds to "101". As such, each memory cell can hold data in accordance with the state of a threshold voltage of the memory cell. The relationship illustrated in FIG. 5 is an example of data coding, and data coding is not limited to the example of FIG. 5.

In three-bit data held in one memory cell, a least significant bit (LSB) is referred to as a lower bit, a most significant bit (MSB) is referred to an upper bit, and a bit between the LSB and the MSB is referred to as a middle bit. A set of the lower bits of all the memory cell transistors MT in the same memory cell group MCG is referred to as a lower page. A set of the middle bits of all the memory cell transistors MT in the same memory cell group MCG is referred to as a middle page. A set of the upper bits of all the memory cell transistors MT in the same memory cell group MCG is referred to as an upper page.

Through the erase operation, the threshold voltage is lowered to state "Er". Through the program operation, the threshold voltage is maintained in state "Er", or raised to any of state "A", state "B", state "C", state "D", state "E", state "F", and state "G".

Specifically, in the program operation, the access circuit 110 selects one of the bit lines BL corresponding to a column address. The access circuit 110 controls the potential of the selected bit line BL to zero. The access circuit 110 selects one of the word lines WL corresponding to a row address, and applies a programming pulse to the selected word line WL. Electrons are then injected into the charge storage layer 16 of a memory cell located at the intersection of the selected bit line BL and the selected word line WL, resulting in increasing the threshold voltage of the memory cell. The access circuit 110 reads data at predetermined timing to check whether or not the threshold voltage of the memory cell has reached an intended state corresponding to data of write data. This may be called a verify read. The access circuit 110 continues to apply a programming pulse until the threshold voltage of the memory cell reaches the intended state.

Hereinafter, a memory cell of which the threshold voltage is set in a certain state through the program operation may be referred to as "a memory cell in a certain state."

A determination voltage is set between every two adjacent states. For example, as illustrated in FIG. 5, a determination voltage Vra is set between states "Er" and "A", a determination voltage Vrb is set between states "A" and "B", a determination voltage Vrc is set between states "B" and "C", a determination voltage Vrd is set between states "C" and "D", a determination voltage Vre is set between states "D" and "E", a determination voltage Vrf is set between states "E" and "F", and a determination voltage Vrg is set between states "F" and "G". In the read operation, data associated with the state of a memory cell concerned is determined depending on different determination voltages.

Assumed that the data coding illustrated in FIG. 5 is applied, for example, when the memory cell is in any of states "Er", "E", "F", and "G", the value of the lower bit held in the memory cell is "1". When the memory cell is in any of states "A", "B", "C", and "D", the value of the lower bit held in the memory cell is "0". Hence, data in the lower page can be determined by two different determination voltages Vra and Vre.

When the memory cell is in any of states "Er", "A", "D", and "E", the value of the middle bit held in the memory cell is "1". When the memory cell is in any of states "B", "C", "F", and "G", the value of the middle bit held in the memory cell is "0". Hence, data in the middle page can be determined from three different determination voltages Vrb, Vrd, and Vrf.

When the memory cell is in any of states "Er", "A", "B", and "G", the value of the upper bit held in the memory cell is "1". When the memory cell is in any of states "C", "D", "E", and "F", the value of the upper bit held in the memory cell is "0". Hence, data in the upper page can be determined from two different determination voltages Vrc and Vrg.

In this manner, the determination voltages used for data determination differ depending on the type of a page to be read. The access circuit 110 uses different determination voltages according to the types of the page to be read in the read operation.

Specifically, in the read operation, the access circuit 110 precharges the bit lines BL with a power supply voltage VDD. The access circuit 110 selects one of the word lines WL corresponding to a row address. The access circuit 110 brings memory cells connected to the unselected word lines WL into conduction, and sequentially applies different determination voltages corresponding to the types of page to be read to the selected word line WL. The access circuit 110 detects a discharge from the charge stored by the precharge to the source line SL by applying the determination voltages thereto to see which one of the determination voltages has caused the discharge. The access circuit 110 thereby determines data corresponding to the state of a memory cell concerned. The access circuit 110 stores the determined data in the latch circuit. The controller 200 can toggle, for example, a read enable (RE) signal, thereby acquiring the data in the latch circuit as read data.

FIG. 5 has illustrated the example where the memory cells exhibit eight non-overlapping distributions. However, the threshold voltage of a memory cell might vary depending on a use history. The use history includes accesses to the memory cell, an elapsed time and a temperature history from the completion of programming to the memory cell, accesses to memory cells adjacent to the memory cell, and a level of wear-out of the memory cell. The level of wear-out of the memory cell is influenced by the number of executed erase operations and program operations to the memory cell, and the temperature at the time of the erase operation and program operation to the memory cell. The threshold voltage of the memory cell might vary, and thus, in reality, the distributions of the states might overlap one another in the read operation.

Figure 6:
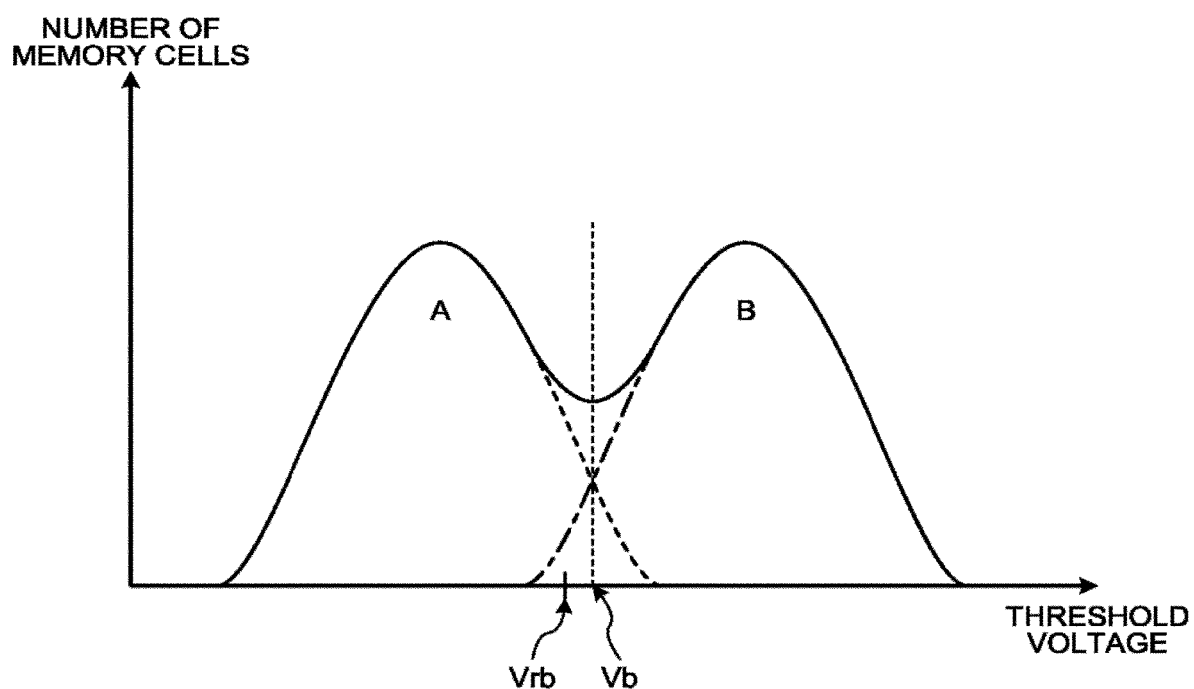
FIG. 6 is a diagram illustrating another example of a possible threshold voltage of the memory cell of the first embodiment.

FIG. 6 is a diagram illustrating another example of a possible threshold voltage of the memory cell of the first embodiment. Herein, for a simple description, the figure illustrates the distribution of memory cells in state "A" or "B" by way of example. The solid line indicates the distribution of the memory cells in state "A" or "B". The broken line indicates the distribution of memory cells in state "A", and the dot-and-dash line indicates the distribution of memory cells in state "B". In the example of FIG. 6, the base of the distribution of the memory cells in state "A" and the base of the distribution of the memory cells in state "B" overlap each other. In other words, the maximum value of the threshold voltages of the memory cells in state "A" exceeds the determination voltage Vrb, and the minimum value of the threshold voltages of the memory cells in state "B" is below the determination voltage Vrb. When a memory cell to be in state "A" exhibiting a higher threshold voltage than the determination voltage Vrb is read, the memory cell is recognized as being in state "B". That is, data programmed as "110" is read as "100". When a memory cell to be in state "B" exhibiting a lower threshold voltage than the determination voltage Vrb is read, the memory cell is recognized as being in state "A". That is, data programmed as "100" is read as "110".

Thus, the value of the read data might differ from the programmed value due to a variation in the threshold voltage. The controller 200 corrects error and shifts the determination voltage to deal with changes in the data and the threshold voltage. Specifically, an error correction code (ECC) circuit 206 (described below) of the controller 200 corrects error in the read data. In the case of a failure of error correction, the controller 200 varies the determination voltage and retries the read operation. The read operation for the retry will be referred to as retry read. A failure of error correction signifies that original data (i.e., before changed) cannot be restored from the changed data. Specifically, a failure of error correction signifies that a bit error in the read data cannot be corrected. A success of error correction signifies that all bit errors in the read data have been corrected. The controller 200 repeats retry read while varying the determination voltage until error correction succeeds.

The value of the determination voltage may be represented by various quantities. Also, setting the value of the determination voltage may be variously instructed. In the embodiment, as an example, a base value is preset for each of the determination voltages (Vra to Vrg), and the value of the determination voltage is represented by a shift amount different from the base value. The memory chip 101 stores the base value for each of the determination voltages in a predetermined location. The controller 200 instructs the memory chip 101 on the shift amount from the base value for each of the determination voltages.

The methods for representing and instructing the determination voltage are not limited to the above examples. For example, the value of the determination voltage may be represented not by the difference but by an absolute voltage value, and the instructions to the memory chip 101 about the determination voltage may be in the form of an absolute voltage value instead of the difference. The location in which base value for each of the determination voltages is stored is not limited to the above examples. For example, the base values may be stored in the controller 200.

In the retry read, the controller 200 acquires a determination voltage to apply in the read operation, referring to a shift index table 220.

FIG. 7 is a diagram illustrating an example of the data structure of the shift index table 220 of the first embodiment. The shift index table 220 stores a plurality of shift patterns. The shift pattern is a set of values including one value for each of all the determination voltages, and indicates candidate values for the determination voltages. The values of the respective determination voltages included in each shift pattern are expressed in the form of the shift amount from the base value. In FIG. 7, a shift amount X (X is A, B, C, D, E, F, or G) represents a difference from the base value of a determination voltage Vrx (x is a, b, c, d, e, f, or g).

The shift index table 220 contains the shift patterns arranged in order in accordance with a degree of variation in the threshold voltage. Each shift pattern is denoted by an index corresponding to the order of arrangement. In other words, the index indicates a rank corresponding to a degree of variation in the threshold voltage.

For example, regarding the degree of variation in the threshold voltage, a first level and a second level indicating more variation than the first level are assumed. A first shift pattern corresponding to the first level is set to a higher rank than a second shift pattern corresponding to the second level.

While repeating a retry read, the controller 200 selects shift patterns for use in the respective retry reads, in the order of the index values.

The designer may be able to estimate in advance how the threshold voltage is likely to vary. In other words, in the shift index table 220 the shift patterns are arranged in the order in accordance with the degree of variation in the threshold voltage estimated in advance by the designer. For example, the degree of variation in the threshold voltage can be estimated, considering the phenomenon as charge loss or leakage from a memory cell. The degree of variation in the threshold voltage by the phenomenon as the memory-cell charge loss or leakage depends on, for example, the number of executed erase operations and program operations. Different shift index tables 220 may be provided according to the number of erase operations and program operations to execute.

Hereinafter, a shift pattern with an index value of "X" may be referred to as a shift pattern of index X. A read operation using the shift pattern with an index value of "X" may be referred to as a pattern X.

The controller 200 further executes a patrol read. The patrol read is a background read operation irrespective of a request of the host apparatus 300. The controller 200 executes the patrol read, for example, regularly or when a predetermined condition related to the use history is satisfied.

In the patrol read, the controller 200 performs one or more read operations including a retry read, and learns a voltage value for successful error correction from the results of the one or more executed read operations. Learning may represent storing values acquired through computation or non-computation, or by a method other than computation. When executing a read operation in response to a request of the host apparatus 300, the controller 200 acquires a voltage value for use as the determination voltage from the learned voltage values.

In the following, the learned voltage values or values indicating voltage values will be referred to as learned values. In the first embodiment, as an example, the index values are recorded as the learned values.

In the following, a data read operation requested by the host apparatus 300, that is, a read operation in response to a request from the host apparatus 300, will be referred to as a host read.

In the first embodiment, one learned value is applied in common to memory areas of a predetermined size larger than the unit of the read operation (that is, a page). The bounds of the memory area to which the common learned value is applied are referred to as a management unit area.

Furthermore, in the first embodiment, the controller 200 selects one page from one management unit area as a representative page, and executes one or more read operations including a retry read on the representative page. If the retry read results in a successful error correction (that is, successful error correction through a plurality of read operations), the controller 200 learns a shift pattern with a higher rank by a predetermined number of ranks than the shift pattern used for the successful error correction.

FIG. 8 is a diagram for explaining an overview of a method for determining a learned value by the controller 200 of the first embodiment. FIG. 8 illustrates the success or failure of error correction through four read operations (patterns 0 to 3), when applying shift patterns of indices 0 to 3 to each of four pages (pages 0 to 3) consisting of one management unit area.

The controller 200 executes one or more read operations to a representative page, using the shift patterns sequentially from the shift pattern of index 0. For example, when page 2 is the representative page, the controller 200 executes patterns 0 and 1 in this order, and fails in error correction with patterns 0 and 1. Next, the controller 200 executes pattern 2 and succeeds in error correction (S1). The controller 200 then identifies the shift pattern used in pattern 2, that is, the shift pattern of index 2 as the shift pattern that is used in the first successful error correction through the one or more read operations, and learns shift pattern 1 that is at a higher rank by one than the identified shift pattern (S2).

In the example of FIG. 8, when pages 0 and 3 are read, error correction succeeds with patterns 0 and 1, and error correction fails with patterns 2 and 3. When page 1 is read, error correction succeeds with patterns 1 and 2, and error correction fails with patterns 0 and 3. In contrast, when page 2 is read, error correction fails with patterns 0 and 1, and error correction succeeds with patterns 2 and 3.

In other words, the variation in the threshold voltage is more in page 2, which is the representative page, than in the other pages. Hence, if a shift pattern that enables page 2 to be read without failure in error correction is applied to a read operation to another page, and another page is the one to be read, error correction is likely to fail in a first read operation and also in a retry read after the first read operation.

For example, when shift pattern 2 is applied, error correction fails in the read operations to pages 0 and 3. Moreover, error correction fails in pages 0 and 3 by a retry read using shift pattern 3.

In contrast, the controller 200 learns a shift pattern with a higher rank than the shift pattern that enables a representative page to be read without failure in error correction. This can increase the possibility of successful error correction in a read operation to another page or a retry read after the read operation even if the variation in the threshold voltage in the representative page is advanced more than that in another page.

For example, using shift pattern 2, pages 1 and 2 can be read without failure in error correction. By using shift pattern 1 ranked higher by one than shift pattern 2, pages 0, 1, and 3 can be read without failure in error correction. In other words, in the case of FIG. 8, learning shift pattern 1 can increase the number of pages that can be read without failure in error correction comparing with learning shift pattern 2.

Error correction fails in a read operation to page 2 with shift pattern 1. However, page 2 can be read without failure in error correction by a next retry read, that is, a retry read using shift pattern 2.

Thus, the controller 200 learns a shift pattern with a higher rank than a shift pattern that enables a representative page to be read without failure in error correction, and uses the learned shift pattern in the host read. This enables to reduce the number of failures in error correction or the number of executed retry reads in the entire management unit area.

In addition, learning a shift pattern with a higher rank than the shift pattern that enables a representative page to be read without failure in error correction provides a merit to reduce a risk that, in a case where the pattern 2 is learned, error correction fails in a read operation with shift pattern 2 and 3, thereby the page 3 falls into unreadable.

A difference in ranks between a shift pattern that enables a representative page to be read without failure in error correction and a leaned shift pattern is not limited to one. For example, a learned shift pattern may be ranked higher by two or more ranks than the shift pattern that enables a representative page to be read without a failure in error correction, or a learned shift pattern may be the shift pattern itself that enables a representative page to be read without failure in error correction.

The bounds of the memory area where the same learned value is applied, that is, the management unit area, can be freely set.

Figure 9:
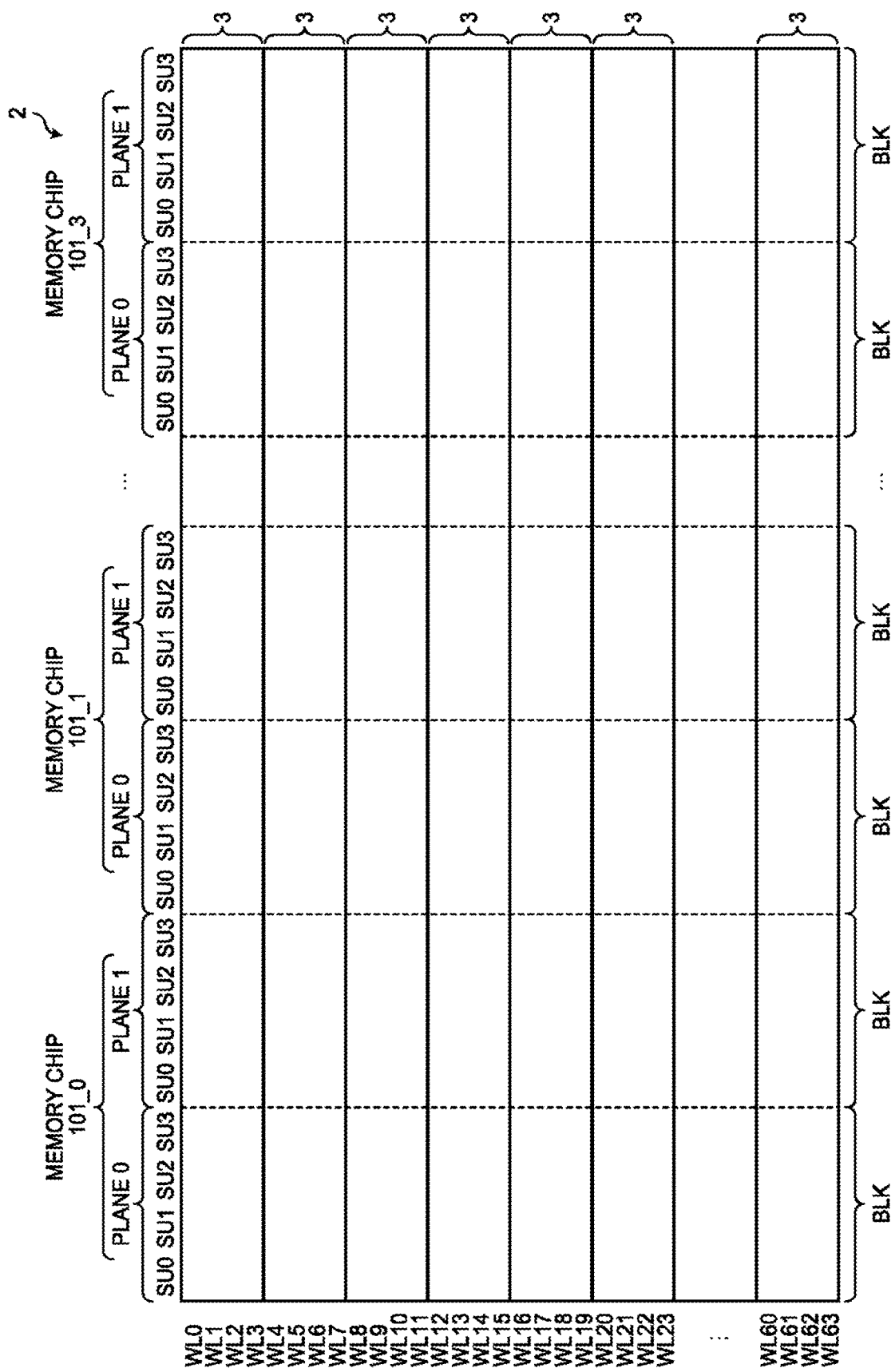
FIG. 9 is a diagram for explaining a method for setting management unit areas in the first embodiment.
Figure 10:
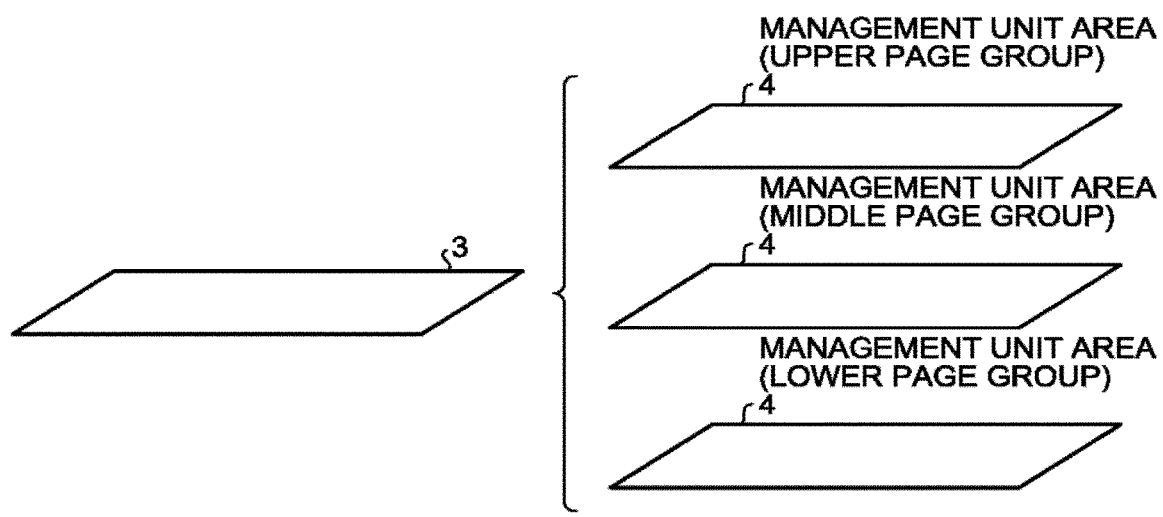
FIG. 10 is another diagram for explaining the method for setting the management unit areas in the first embodiment.

FIGS. 9 and 10 are diagrams for explaining a method for setting the management unit areas in the first embodiment. Herein, two blocks BLKs in different planes are selected from each of the four memory chips 101, and the selected eight blocks BLKs form one logical block. FIG. 9 illustrates group 2 of the NAND strings 114 of eight blocks BLKs forming the same logical block. The group 2 is equally divided into 16 subgroups 3 in a direction in which the word lines are arranged. In other words, each subgroup 3 includes four successive word lines. Each subgroup 3 is provided across four string units SU constituting one block BLK and across eight blocks BLKs constituting one logical block. As illustrated in FIG. 10, a memory area including upper pages of each subgroup 3 (an upper page group), a memory area including middle pages of each subgroup 3 (a middle page group), and a memory area including lower pages of each subgroup 3 (a lower page group) are respectively set as management unit areas 4. In other words, one subgroup 3 includes three management unit areas 4 containing different types of pages.

Successive word lines tend to exhibit similar threshold-voltage variation characteristics. Moreover, word lines through which the controller 200 accesses the blocks BLKs of one logical block in parallel tend to exhibit similar threshold-voltage variation characteristics. Hence, according to the setting method for the management unit areas 4 illustrated in FIGS. 9 and 10, it is possible to set, as one management unit area 4, the bounds of memory areas showing the similar threshold-voltage variation characteristics. Hence, using the same learned value in the management unit areas 4, it becomes possible to read a larger number of pages of the management unit areas 4 without failure in error correction. The method for setting the management unit areas 4 is not limited to the method illustrated in FIGS. 9 and 10.

As illustrated in FIG. 1, the controller 200 includes a host interface circuit (HOST I/F) 201, a random access memory (RAM) 202, a central processing unit (CPU) 203, a buffer memory 204, a NAND interface circuit (NAND I/F) 205, and the ECC circuit (ECC) 206. The controller 200 can be configured as, for example, a system-on-a-chip (SoC). The controller 200 may be configured of a plurality of chips. The controller 200 may include a field-programmable gate array (FPGA) or an application specific integrated circuit (ASIC) instead of the CPU 203. In other words, the controller 200 can be configured by software, hardware, or a combination of both.

The host interface circuit 201 is connected to the host apparatus 300 via a bus pursuant to, for example, the serial advanced technology attachment (SATA) standard, the serial attached SCSI (SAS) standard, or the peripheral components interconnect express (PCIe) (registered trademark) standard, and is responsible for communication between the controller 200 and the host apparatus 300.

The NAND interface circuit 205 is connected to each memory chip 101 via the NAND bus 400, and is responsible for communication between the controller 200 and the memory chip 101.

The CPU 203 controls the operation of the controller 200.

The RAM 202 is used as a work area of the CPU 203. The buffer memory 204 temporarily holds data transmitted to and from the memory chips 101. The RAM 202 and the buffer memory 204 can include, for example, a dynamic random access memory (DRAM), a static random access memory (SRAM), or a combination of both. The memory types of the RAM 202 and the buffer memory 204 are not limited to the above examples.

The ECC circuit 206 detects error and corrects the detected error, using an error correction code.

Figure 11:
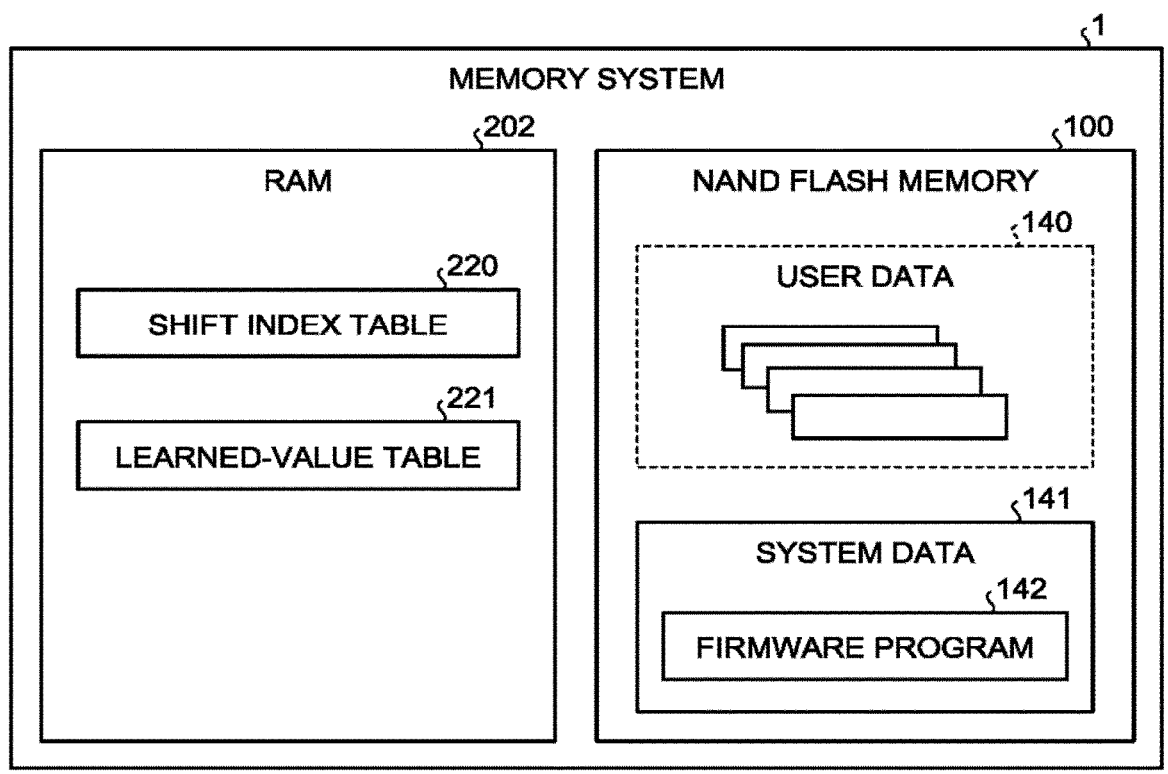
FIG. 11 is a diagram explaining various types of data held in the memory system of the first embodiment.

FIG. 11 is a diagram explaining various types of data held in the memory system 1 of the first embodiment.

The NAND flash memory 100 stores user data 140 and system data 141. The user data 140 is data transmitted from the host apparatus 300 and encoded by the ECC circuit 206 using an error correction code. In this specification, the term "data" refers to at least the user data 140.

The system data 141 is data required to control the controller 200. The system data 141 includes a firmware program 142. The firmware program 142 is a computer program for the CPU 203 to implement control over the operation of the controller 200. The CPU 203 loads the firmware program 142 into the RAM 202, for example, upon startup of the memory system 1. The CPU 203 then operates in accordance with the firmware program 142 loaded in the RAM 202 to implement control over the operation of the controller 200.

The RAM 202 stores the shift index table 220 and a learned-value table 221.

As described above, the shift index table 220 contains information of defined shift patterns. Indices for use as ranks for selecting are assigned to the various shift patterns.

The learned-value table 221 contains information of recorded learned values. The controller 200 records, in the learned-value table 221, a learned value acquired by the patrol read. In the host read, the controller 200 determines a corresponding learned value from the learned-value table 221. The learned-value table 221 may be collectively or regularly saved in the NAND flash memory 100 before the memory system 1 shuts down, and loaded from the NAND flash memory 1 into the RAM 202 upon startup of the memory system 1. Alternatively, a part or whole of the learned-value table 221 may be lost upon power-off.

Figures 12, 13:
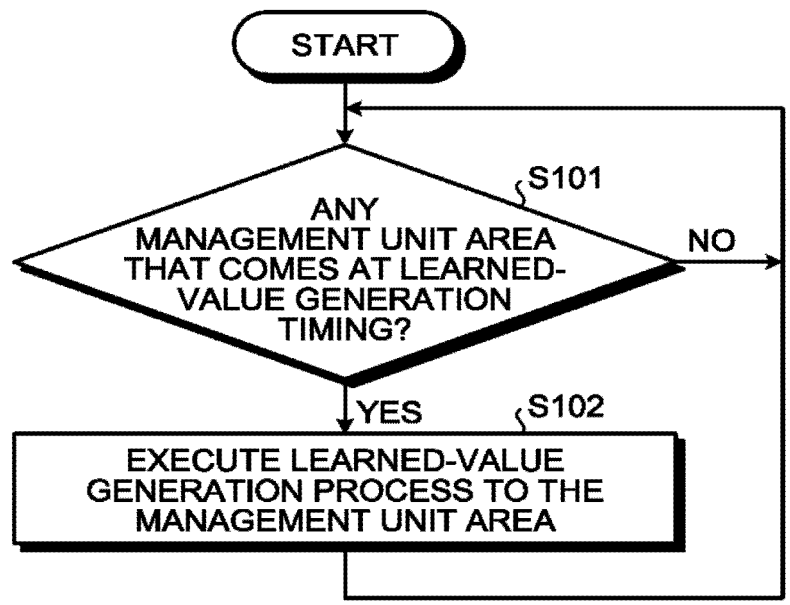
FIG. 12 is a diagram illustrating an example of the data configuration of a learned-value table in the first embodiment.
FIG. 13 is a flowchart illustrating an overview of a patrol read procedure of the first embodiment.

FIG. 12 is a diagram illustrating an example of the data structure of the learned-value table 221 in the first embodiment. As illustrated in FIG. 12, the learned-value table 221 stores a learned value for each management unit area 4. As described above, in the first embodiment, an index value indicating one of the shift patterns recorded in the shift index table 220 is recorded as the learned value in the learned-value table 221.

The memories to store the firmware program 142, the shift index table 220, and the learned-value table 221 are not limited to the above memories. For example, the shift index table 220 may be stored in the memory chip 101. In addition to the RAM 202 and the memory chip 101, the memory system 1 may include any type of memory to store a part or all of the firmware program 142, the shift index table 220, and the learned-value table 221.

Next, the operation of the memory system 1 of the first embodiment is described.

FIG. 13 is a flowchart illustrating an overview of a patrol read procedure of the first embodiment. As illustrated in FIG. 13, the CPU 203 first determines whether or not there is any management unit area 4 which comes at a timing at which a learned-value is to be generated (S101).

The learned-value generation timing can be freely set. For example, the CPU 203 selects each management unit area 4 from all the management unit areas 4 where the data programming has been completed, as a subject of the learned-value generation, at predetermined time intervals. That is, after a lapse of a certain length of time from the completion of the programming to a certain management unit area 4, the CPU 203 determines that now is the learned-value generation timing for the certain management unit area 4. After elapse of a certain length of time from the completion of the generation of the learned value for the management unit area 4, the CPU 203 determines again that now is the learned-value generation timing for the management unit area 4.

For another example, the CPU 203 records individual access histories of all the management unit areas 4 where the data programming has been completed. The access history is, for example, the number of executed read operations. The CPU 203 individually selects, as a subject of the learned-value generation, all the management unit areas 4 where the data programming has been completed, whenever the access history satisfies a predetermined condition. For example, when an increment of the number of executed read operations to a certain management unit area 4 after the completion of the program operation or after a previous learned-value generation reaches a predetermined value, the CPU 203 determines that now is the learned-value generation timing for the certain management unit area 4.

For still another example, the startup of the memory system 1 may be set as the learned-value generation timing. The CPU 203 may determine the learned-value generation timing after a lapse of a certain length of time since the startup of the memory system 1.

With any management unit area 4 at the learned-value generation timing found (Yes in S101), the CPU 203 executes a learned-value generation process for the management unit area 4 (S102). With no management unit area 4 at the learned-value generation timing found (No in S101), or after S102, the CPU 203 re-executes the operation in S101.

Figure 14:
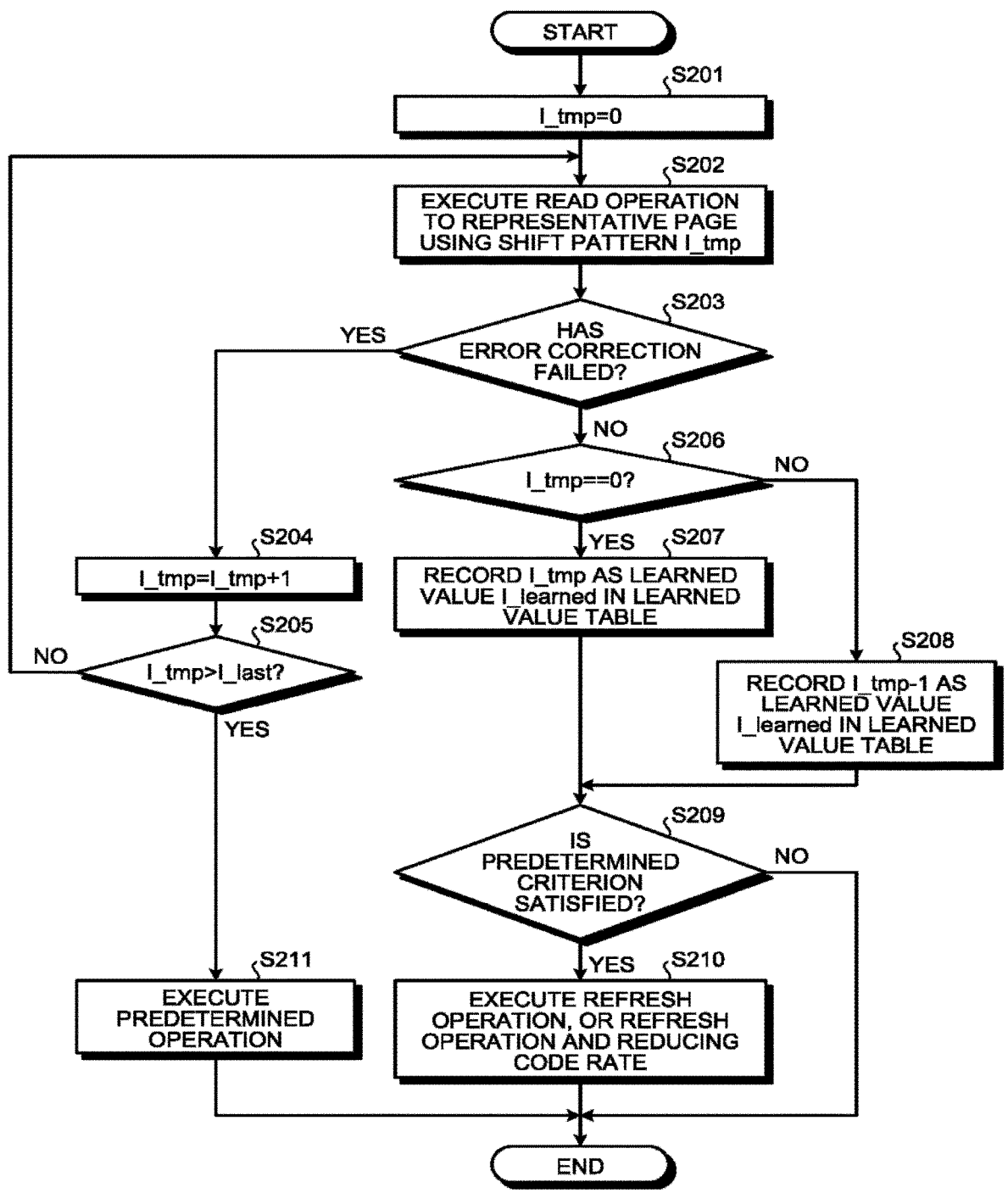
FIG. 14 is a flowchart explaining a learned-value generation procedure of the first embodiment.

FIG. 14 is a flowchart for explaining a learned value generation procedure of the first embodiment. In the description of FIG. 14, the management unit area 4 as a subject of the learned-value generation process is referred to as a target management unit area 4.

Firstly, the CPU 203 initializes a variable I_tmp to zero (S201). The CPU 203 then uses a shift pattern I_tmp, that is, a shift pattern with an index value "I_tnmp", to execute a read operation to a representative page of the target management unit area 4 (S202). In S202, the CPU 203 instructs the memory chip 101 that includes the representative page about the shift pattern I_tmp, and commands a read operation thereto.

The representative page can be freely set. The representative page may be preset in each management unit area 4, or one or more pages may be selected as the representative page(s) by any algorithm upon every execution of the learned-value generation process. The representative page may include one page, or may include two or more pages of one logical page. Among the pages of the management unit area 4, a page exhibiting a typical threshold-voltage variation may be selected as the representative page, or a page exhibiting the largest threshold-voltage variation may be selected as the representative page. A bit error rate may be measured in each page to select, as the representative page, a page exhibiting the highest bit error rate from among the pages of the management unit area 4.

After S202, in the memory chip 101 having received a read command, the access circuit 110 executes the read command using the instructed shift pattern, and stores read data in the latch circuit. In the controller 200, the NAND interface circuit 205 acquires the read data from the latch circuit, and the ECC circuit 206 detects and corrects error in the acquired read data. The CPU 203 is notified of a success or failure of the error correction.

The CPU 203 determines whether or not the ECC circuit 206 has failed in the error correction (S203). Upon determining a failure of the error correction (Yes in S203), the CPU 203 increments I_tmp by one (S204), and determines whether or not I_tmp exceeds an index value I_last of a shift pattern recorded at the bottom of the shift index table 220 (S205).

If I_tmp does not exceed the index value I_last (No in S205), the CPU 203 re-executes the operation of S202.

Upon determining a success of the error correction (No in S203), the CPU 203 determines whether or not I_tmp is zero (S206). If I_tmp is zero (Yes in S206), the CPU 203 records I_tmp, that is, zero in the learned-value table 221 as a learned value I_learned for the target management unit area 4(S207). If I_tmp is not zero (No in S206), the CPU 203 records the value of I_tmp−1 in the learned-value table 221 as the learned value I_learned for the target management unit area 4 in the first embodiment (S208).

After S207 or S208, the CPU 203 determines whether or not a predetermined criterion has been satisfied (S209). The operation in S209 is for determining whether or not to execute an operation (S210) for preventing data loss from the target management unit area 4 due to a variation in the threshold voltage. In S210, the CPU 203 executes, for example, a refresh operation, or the refresh operation and a code-rate reduction.

The refresh operation is to reprogram at least all valid data stored in a target memory area (for example, the management unit area 4). For example, in the refresh operation, all the valid data stored in the target memory area is copied to another memory area, and then all the data stored in the memory area as the copy source is erased. The memory area being the copy source and the memory area being the copy destination may be the same. If the memory area as the copy source and the memory area as the copy destination are the same, at least all the valid data is read from the data stored in the target memory area into, for example, the RAM 202, and then all the data is erased from the target memory area. The data read into the RAM 202 is written into the data-erased target memory area. By the refresh operation, data stored with a large threshold-voltage variation can be re-stored with a small threshold-voltage variation.

The code rate refers to the ratio of the number of input bits to the number of output bits at the time of error correction coding. Along with a decrease in the code rate, the ratio of the length of the error correction code to the size of data to be encoded (data before error correction coding) increases, which improves the error correction performance of the ECC circuit 206 in return for a reduction in the size of data to be encoded that can be stored in the management unit area 4. The code rate is set for, for example, each predetermined area such as a block. To write the user data 140 into a certain block, the user data 140 is encoded at the set code rate for the block, and written into the block.

The predetermined criterion used in S209, that is, the condition for execution or non-execution of the operation of S210, may be freely set. In S209 a determination is made on whether or not the shift index value used at the time of a successful error correction, that is, the value of I_tmp when the result of S203 is a negative determination (i.e., No in S203), exceeds a predetermined threshold, for example. If the shift index value used at the time of a successful error correction exceeds the threshold, the result of S209 will be a positive determination (i.e., Yes in S209). If the shift index value used at the time of a successful error correction does not exceed the threshold, the result of S209 will be a negative determination (i.e., No in S209).

Upon satisfaction of the predetermined criterion (Yes in S209), the CPU 203 executes the operation of S210.

Upon no satisfaction of the predetermined criterion (No in S209), or completion of the execution of S210, the learned-value generation process for the target management unit area 4 ends. Upon satisfaction of the predetermined criterion (Yes in S209), the learned-value generation process for the target management unit area 4 may end after the operation of S209, and the operation of S210 may be executed later at any timing.

With the shift index value I_tmp exceeding I_last (Yes in S205), that is, with no shift pattern resulting in successful error correction, the CPU 203 executes a predetermined operation (S211) and ends the learned-value generation process for the target management unit area 4. In S211, any operation can be executed. For example, if the controller 200 includes an error correction function with higher-level error correction than the ECC circuit 206, the controller 200 may perform error correction using the error correction function. Without such an error correction function, the controller 200 may notify the host apparatus 300 of information that the data stored in the target management unit area 4 is unreadable. A distribution read which is explained later may be executed in S211. The timing of notification of the information that the data is unreadable from the target management unit area 4 may be later timing when the host apparatus 300 issues a read request for the data. Moreover, in S211 the operation of S210 may be executed.

Figure 15:
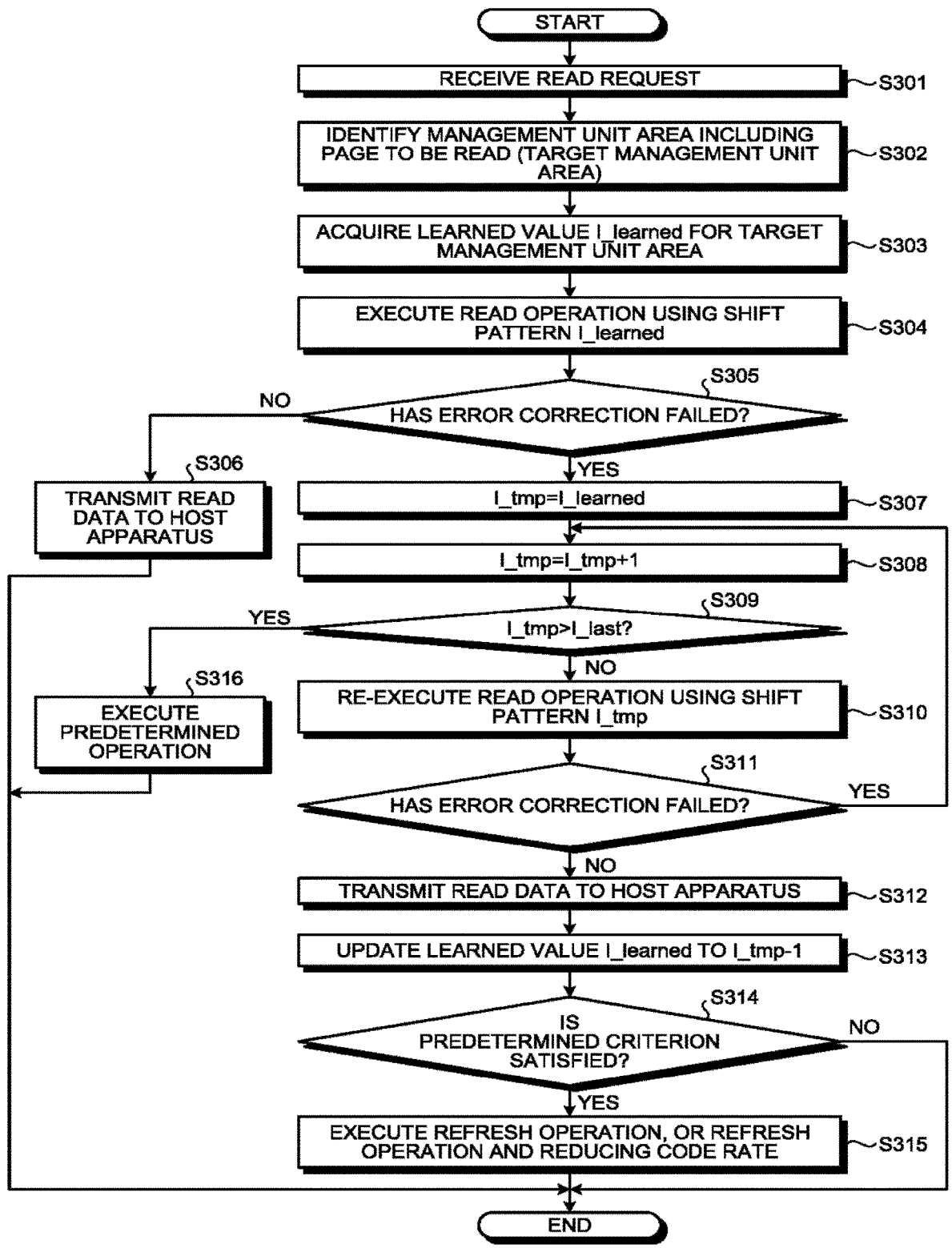
FIG. 15 is a flowchart illustrating a host read procedure of the first embodiment.

FIG. 15 is a flowchart illustrating a host read procedure of the first embodiment.

When the memory system 1 receives a read request from the host apparatus 300 (S301), the CPU 203 identifies a management unit area 4 including a page to be read (S302). In the illustration of FIG. 15, the management unit area 4 including the page to be read is referred to as a target management unit area 4. The read request includes, for example, address information indicating data to be read. The CPU 203 identifies the page to be read in a predetermined method on the basis of the address information included in the read request, and identifies the management unit area 4 including the page to be read.

Next, the CPU 203 acquires the learned value I_learned for the target management unit area 4 from the learned-value table 221 (S303). The CPU 203 then uses a shift pattern I_learned, that is, a shift pattern with an index value "I_learned" to execute a read operation to the page to be read (3304). In S304, the CPU 203 instructs the memory chip 101 including the page to be read about the shift pattern I_learned, and commands a read operation to the page.

After S304, the access circuit 110 of the memory chip 101 concerned executes the read command using the instructed shift pattern, and stores read data in the latch circuit. In the controller 200, the NAND interface circuit 205 acquires the read data from the latch circuit, and the ECC circuit 206 detects and corrects error in the acquired read data. The CPU 203 is notified of a success or failure of the error correction.

The CPU 203 determines whether or not the ECC circuit 206 has failed in the error correction (S305). Upon determining a success of the error correction (No in S305), the CPU 203 transmits the read data to the host apparatus 300 (S306).

Upon determining a failure of the error correction (Yes in S305), the CPU 203 attempts a retry read in the following operations.

Specifically, the CPU 203 first substitutes I_learned into the variable I_tmp (S307). The CPU 203 then increments I_tmp by one (S308), and determines whether or not I_tmp exceeds I_last (S309).

If I_tmp does not exceed I_last (No in S309), the CPU 203 uses the shift pattern I_tmp to re-execute the read operation to the page to be read (S310). The use of the shift pattern and the read operation are executed in the same manner as in S304.

Through the operation of S310, the controller 200 acquires the read data. The ECC circuit 206 detects and corrects error in the acquired read data. The CPU 203 determines whether or not the ECC circuit 206 has failed in the error correction (S311). Upon determining a failure of the error correction (Yes in S311), the CPU 203 re-executes the operation of S308.

Upon determining a success of the error correction (No in S311), the CPU 203 transmits the read data to the host apparatus 300 (S312). Furthermore, the CPU 203 updates the learned value for the target management unit area 4 to I_tmp−1 (S313). The CPU 203 then executes operations in S314 and S315 as in S209 and S210, and ends the host read operation.

If I_tmp exceeds I_last (Yes in S309), in S316, the CPU 203 executes a predetermined operation as in S211, and ends the host read operation. The operation in S211 and the operation in S316 may be different from each other.

As described above, according to the first embodiment, the controller 200 executes a read operation in the patrol read. With an unsuccessful error correction in the first read operation (Yes in S203), the controller 200 repeatedly executes read operations including the first read operation. In the read operations, as indicated by the loop of the operations from S202 to No in S205, the shift patterns being candidate values for the determination voltage are selected and applied one by one in order corresponding to a degree of variation in the threshold voltage. The controller 200 then learns a shift pattern having a higher rank by a predetermined number of ranks than a shift pattern used in a read operation which results in the first success of error correction, among the read operations. Then the controller 200 uses, in the host read, the learned shift pattern to execute a read operation (S208, S303, and S304).

That is, the controller 200 uses, in the host read, a shift pattern (referred to as a second shift pattern) selected upon assuming that the degree of variation in the threshold voltage is smaller than that at the time of selecting a shift pattern (referred to as a first shift pattern) that has resulted in a successful error correction in the patrol read.

As described above referring to FIG. 8, it is thus possible to reduce the number of read operations to the entire management unit area 4 before error correction succeeds. As a result, the deterioration of read latency can be reduced.

Alternatively, the controller 200 may be configured to learn a shift pattern used in a read operation that has resulted in the first successful error correction among a plurality of read operations, and employ a shift pattern with a higher rank by a predetermined number of ranks than the learned shift pattern in the host read.

The controller 200 first uses the second shift pattern to execute a read operation in the host read (S303 and S304). If error correction fails in the read operation (Yes in S305), the controller 200 uses a shift pattern with an index value greater than the second shift pattern, that is, with a lower rank than the second shift pattern, to execute a read operation (retry read) (S308 to S310).

In the host read, the controller 200 employs shift patterns sequentially from the second shift pattern having a higher rank than the first shift pattern, to execute one or more read operations, thereby efficiently searching for a shift pattern that enables a read without failure in error correction.

The CPU 203 selects one representative page from the management unit area 4 as a subject of the patrol read, and applies the obtained learned value to the entire management unit area 4.

This makes it possible to reduce the number of read operations to the entire management unit area 4 before error correction succeeds. Moreover, not the entire management unit area 4 but the representative page is read in the patrol read, which can lower a load required for the patrol read.

The number of representative pages set in one management unit area 4 is not limited to one. Two or more representative pages may be set, and in the patrol read a shift pattern may be learned on the basis of the result of a read operation to each representative page.

In the above description, the shift patterns are used sequentially from a shift pattern with a shift index of zero in the learned-value generation process, by way of example. A shift pattern to be initially used is not limited thereto. With a recorded learned value available, the shift patterns may be used sequentially from the one with a shift index indicated by the learned value.

Moreover, in the above description, the shift patterns are used in the patrol read in the order of shift indices. The use order of the shift patterns in the patrol read is not limited thereto. The shift patterns may be used in descending order of shift indices. The use order of the shift patterns may be variously changeable as long as a shift pattern at the time of a successful error correction can be acquired.

Second Embodiment

In a second embodiment, the controller 200 finds a shift pattern having resulted in a successful error correction (referred to as the first shift pattern) in the learned-value generation process. The controller 200 then uses the first shift pattern to execute a read operation in the host read. With a failure of error correction in the read operation, the controller 200 uses a shift pattern with a higher rank than the first shift pattern (referred to as the second shift pattern) to execute a retry read.

In the second embodiment, a difference between the ranks of the first and second shift patterns is set to one. The difference between the ranks of the first and second shift patterns may be two or more.

An overview of a patrol read of the second embodiment is similar to that of the first embodiment illustrated in FIG. 13, therefore, its description is omitted.

Figure 16:
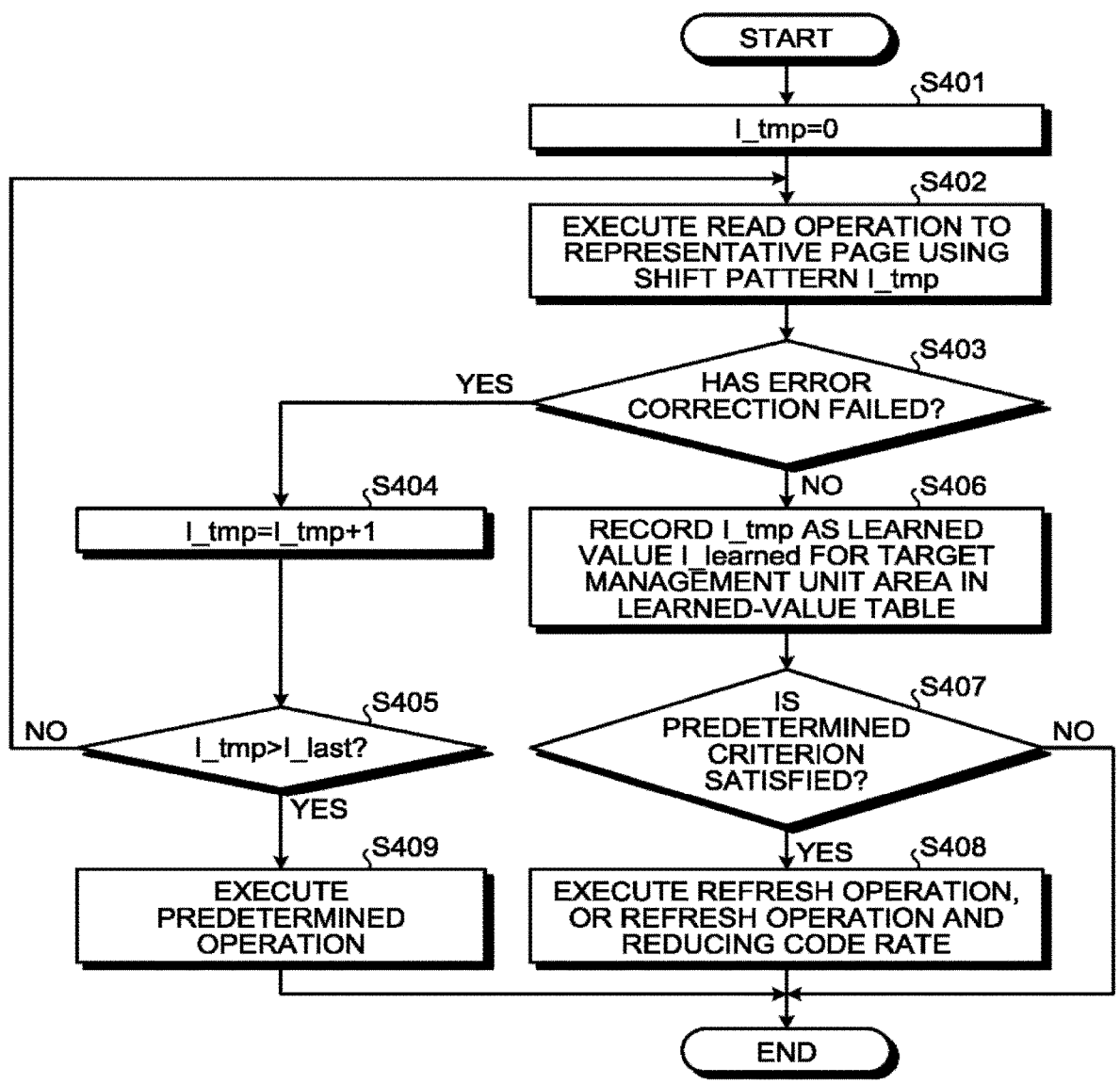
FIG. 16 is a flowchart explaining a learned-value generation procedure of a second embodiment.

FIG. 16 is a flowchart explaining a learned-value generation procedure of the second embodiment. In the description of FIG. 16, the management unit area 4 as a subject of the learned-value generation process is referred to as a target management unit area 4.

In S401 to S405, operations are executed as in S201 to S205 of FIG. 14. Thus, in S401 to S405 the CPU 203 executes one or more read operations, using the shift pattern I_tmp while incrementing the variable I_tmp sequentially from zero.

While executing the one or more read operations in S401 to S405, when the error correction first succeeds (No in S403), the CPU 203 records I_tmp that has resulted in the first successful error correction in the learned-value table 221 as the learned value I_learned for the target management unit area 4(S406).

Subsequent to S406, the CPU 203 executes operations in S407 and S408 as in S209 and S210, and ends the learned-value generation process.

If I_tmp exceeds I_last (Yes in S405), which means no shift pattern enabling a read without failure in error correction has been found, the CPU 203 executes an operation in S409 as in S211, and ends the learned-value generation process.

Figure 17:
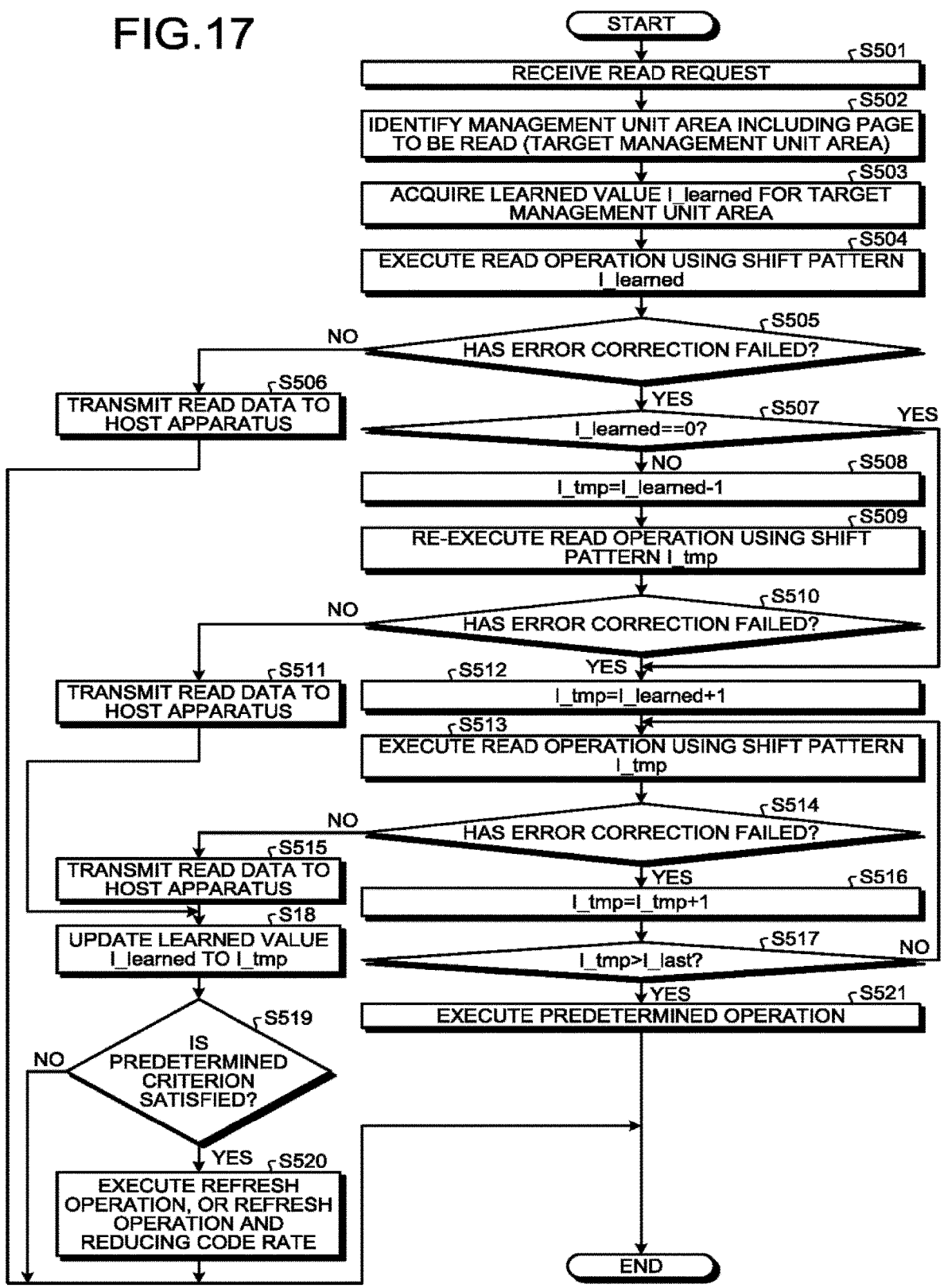
FIG. 17 is a flowchart illustrating a host read procedure of the second embodiment.

FIG. 17 is a flowchart illustrating a host read procedure of the second embodiment. In the description of FIG. 17, the management unit area 4 including a page to be read is referred to as a target management unit area 4.

In S501 to S506, operations are executed as in S301 to S306 of FIG. 15. With a failure of error correction in the first read operation using the shift pattern I_learned (Yes in S505), the CPU 203 attempts a retry read in the subsequent operations.

Specifically, the CPU 203 first determines whether or not I_learned matches zero (S507). With I_learned not matching zero (No in S507), the CPU 203 substitutes I_learned−1 into the variable I_tmp (S508). The CPU 203 then uses the shift pattern I_tmp to re-execute a read operation to the page to be read (S509).

By the operation of S509, the controller 200 acquires read data. The ECC circuit 206 detects and corrects error in the acquired read data. The CPU 203 determines whether or not the ECC circuit 206 has failed in error correction (S510). Upon determining a success of the error correction (No in S510), the CPU 203 transmits the read data to the host apparatus 300 (S511).

Upon determining a failure of the error correction (Yes in S510), or determining that I_learned matches zero (Yes in S507), the CPU 203 substitutes I_learned+1 into the variable I_tmp (S512). The CPU 203 then uses the shift pattern I_tmp to re-execute a read operation to the page to be read (S513).

By the operation of S513, the controller 200 acquires read data. The ECC circuit 206 detects and corrects error in the acquired read data. The CPU 203 determines whether or not the ECC circuit 206 has failed in error correction (S514). Upon determining a success of the error correction (No in S514), the CPU 203 transmits the read data to the host apparatus 300 (S515).

Upon determining a failure of the error correction (Yes in S514), the CPU 203 increments I_tmp by one (S516), and determines whether or not I_tmp exceeds I_last (S517). With I_tmp not exceeding I_last (No in S517), the CPU 203 re-executes the operation of S513.

After transmitting the read data to the host apparatus 300 in S511 or S515, the CPU 203 updates the learned value for the target management unit area 4 to I_tmp (S518). The CPU 203 then executes operations in S519 and S520 as in S209 and S210, and ends the host read operation.

WIth I_tmp exceeding I_last (Yes in S517), the CPU 203 executes a predetermined operation as in S211 (S521), and ends the host read operation.

As such, according to the second embodiment, in the patrol read the controller 200 acquires a shift pattern used in a read operation that has resulted in the first successful error correction among a plurality of read operations (S406). In the host read, the controller 200 uses the acquired shift pattern first to execute a read operation (S503 and S504). If error correction fails in the read operation (Yes in S505), the controller 200 uses a shift pattern with a higher rank by a predetermined number of ranks than the first used shift pattern, to execute a read operation (S508 and S509).

In other words, in the second embodiment, in the host read, the first shift pattern is initially used in a read operation. The second shift pattern with a higher rank than the first shift pattern is used next to execute a retry read. Hence, the first and second embodiments are different only in that the use order of the first and second shift patterns is reverse. Hence, the second embodiment enables efficient search for a shift pattern that enables a read without failure in error correction, which leads to a reduction in the deterioration of read latency.

In the above description, the shift patterns are used sequentially from the shift pattern with a shift index of zero in the learned-value generation process. The shift pattern to be used first is not limited thereto. With a recorded learned value available, the shift patterns may be used sequentially from around a shift index indicated by the learned value.

Third Embodiment

In a third embodiment, a plurality of read operations is executed to two or more pages of the management unit area 4 using all the shift patterns. The results of the executed read operations are subjected to a statistical process to compute a learned value. In other words, in the third embodiment, a determination voltage which allows as many pages as possible in the management unit area 4 to be read without failure in error correction is computed on the basis of the results of the read operations to the pages.

An overview of a patrol read of the third embodiment is similar to that of the first embodiment illustrated in FIG. 13, therefore, its description is omitted.

Figure 18:
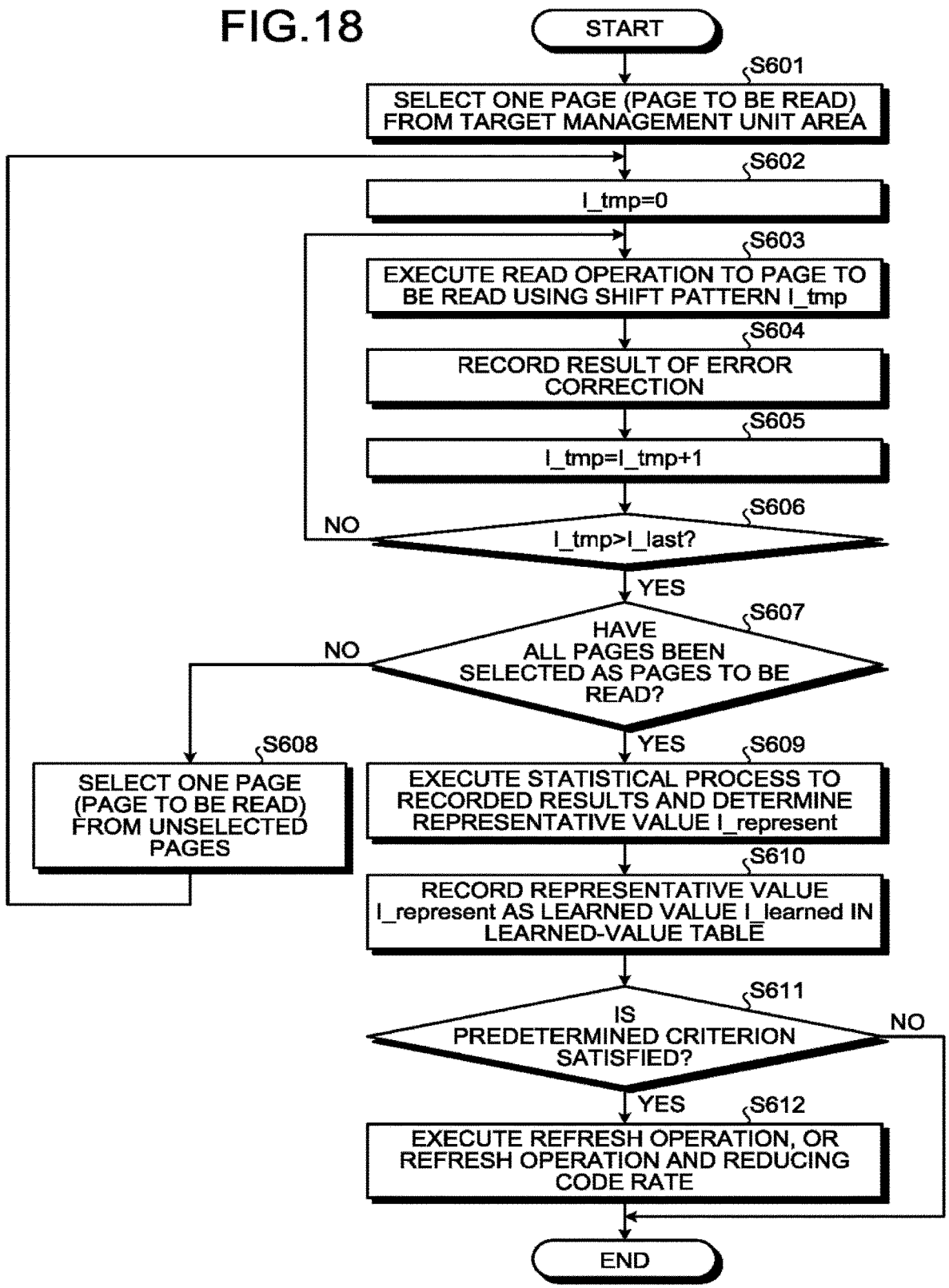
FIG. 18 is a flowchart explaining a learned-value generation procedure of a third embodiment.

FIG. 18 is a flowchart explaining a learned-value generation procedure of the third embodiment. In the description of FIG. 18, the management unit area 4 as a subject of the learned-value generation process is referred to as a target management unit area 4. FIG. 18 shows the example of reading all the pages of the target management unit area 4.

Firstly, the CPU 203 selects one page as a page to be read from the target management unit area 4 (S601). The CPU 203 then initializes the variable I_tmp to zero (S602). The CPU 203 then uses the shift pattern I_tmp to execute a read operation to the page in question (S603).

By the operation of S603, the controller 200 acquires read data. The ECC circuit 206 detects and corrects error in the acquired read data. The CPU 203 records a result of the error correction by the ECC circuit 206 (S604). The result of the error correction represents a success or failure of the error correction. The CPU 203 records the result of the error correction in, for example, the RAM 202 in association with the read page and the index value of the shift pattern.

Next, the CPU 203 increments I_tmp by one (S605), and determines whether or not I_tmp exceeds I_last (S606). With I_tmp not exceeding I_last (No in S606), the CPU 203 re-executes the operation of S603.

With I_tmp exceeding I_last (Yes in S606), the CPU 203 determines whether or not all the pages have been selected as the pages to be read from the target management unit area 4 (S607). With unselected pages remaining (No in S607), the CPU 203 selects one of the unselected pages as the page to be read (S608), and re-executes the operation of S602.

If all the pages have been selected as the pages to be read from the target management unit area 4 (Yes in S607), the CPU 203 executes a predetermined statistical process to the results of the executed error corrections to all the pages of the target management unit area 4, and determines a representative value I_represent (S609).

In S609, for example, the CPU 203 computes the mode of the index values of the shift patterns from the results of the executed error corrections to all the pages of the target management unit area 4. The computed mode indicates a shift pattern which results in a largest number of readable pages, among all the pages of the target management unit area 4, without failure in error correction.

The statistical process is not limited to this example. The CPU 203 may compute the average of the threshold voltages instead of the mode. Alternatively, the CPU 203 may compute the average of the threshold voltages by assigning weights to the number of successfully corrected pages or the number of bit errors. The learned-value table 221 may contain no indices but voltage values (shift amount). Both of voltage values (shift amount) and indices may be recorded in the learned-value table 221.

After S609, the CPU 203 records the representative value I_represent as the learned-value I_learned for the target management unit area 4 in the learned-value table 221 (S610).

Subsequent to S610, the CPU 203 executes operations in S611 and S612 as in S209 and S210, and ends the learned-value generation process.

Figure 19:
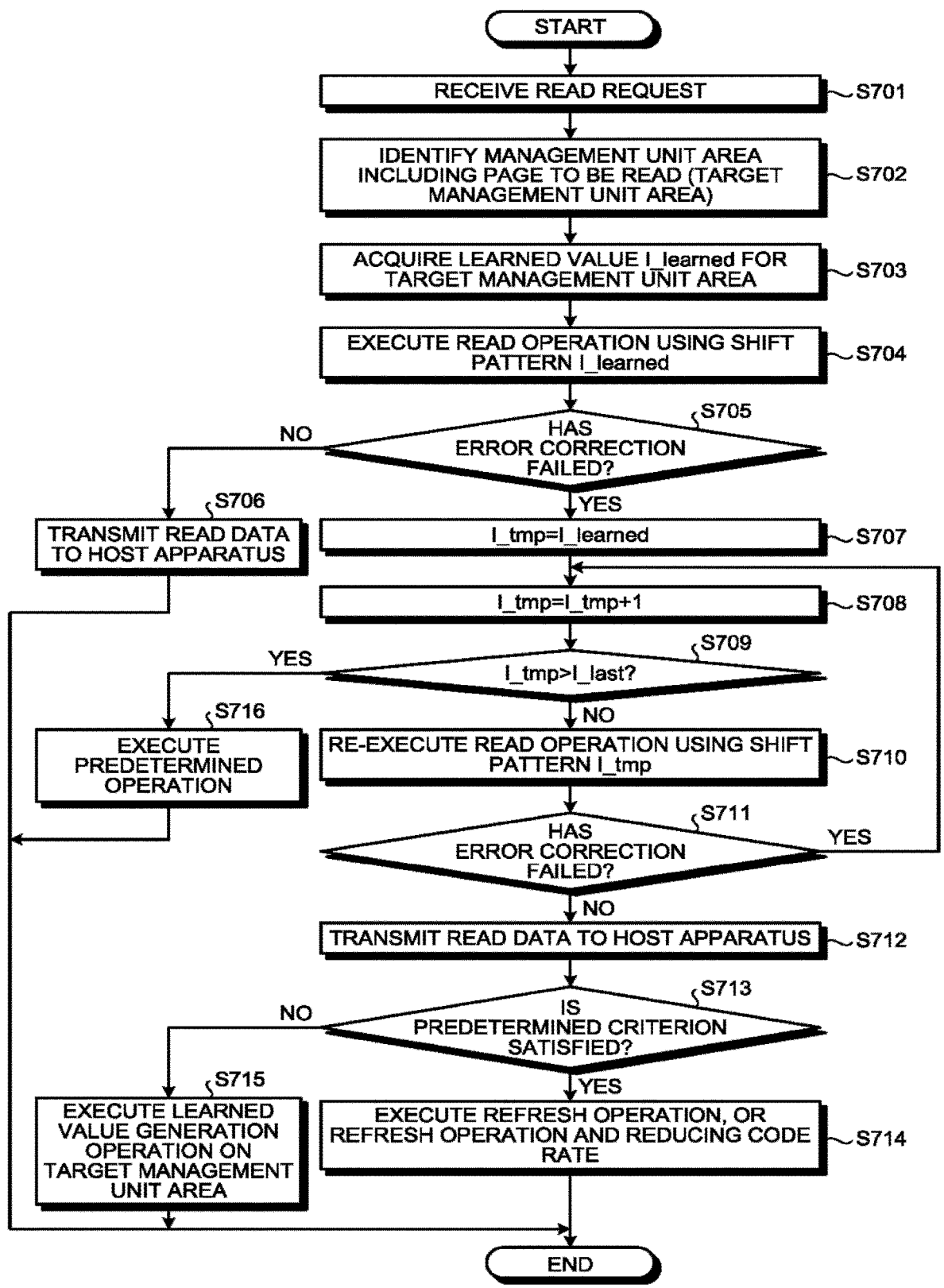
FIG. 19 is a flowchart illustrating a host read procedure of the third embodiment.

FIG. 19 is a flowchart illustrating a host read procedure of the third embodiment. In the description of FIG. 19, the management unit area 4 including a page to be read is referred to as a target management unit area 4.

In S701 to S712, operations are executed as in S301 to S312. Thus, a first read operation is executed using the shift pattern I_learned (S704). With a failure of error correction to read data obtained by the read operation (Yes in S705), the CPU 203 executes one or more retry reads while varying the determination voltage in the order of indices (S708 to S711).

Upon a successful error correction to the read data obtained by the retry read (No in S711), the CPU 203 transmits the read data to the host apparatus 300 (S712). The CPU 203 then determines whether or not a predetermined criterion is satisfied (S713). S713 is an operation for determining whether or not to execute an operation for preventing data loss from the target management unit area 4 due to the variation in the threshold voltage, and is, for example, the same operation as S209. If the predetermined criterion is satisfied (Yes in S713), the CPU 203 executes a refresh operation, a code-rate reduction, or both of them (S714), for example.

If the predetermined criterion is not satisfied (No in S713), the CPU 203 executes the learned-value generation process to the target management unit area 4 (S715).

After the operation of S714 or S715, the host read operation ends. The host read operation may end after the operation of S713, and the operation of S714 or S715 may be executed at any later timing.

If I_tmp exceeds I_last in the retry read (Yes in S709), the CPU 203 executes a predetermined operation as in S211 (S716), and ends the host read operation.

Thus, according to the third embodiment, in the patrol read, the controller 200 sequentially uses all the shift patterns, that is, different voltage values, and executes a plurality of read operations (S602 to S608), to decide a learned value by the statistical process based on the results of the read operations (S609). In the host read, the controller 200 uses the decided learned value to execute a read operation (S704).

By such operations, the controller 200 can select an optimal voltage value from the voltage values applied as determination voltages, which can reduce the occurrence of error and the number of retry reads to be executed. Hence, it is possible to reduce the deterioration of read latency.

In the example described above, all the pages of the management unit area 4 are selected as the pages to be read in the patrol read. Selection of all the pages of the management unit area 4 as the pages to be read is not always necessary in the patrol read. A part of the pages (e.g., one or more pages) of the management unit area 4 may be selected as the page(s) to be read in the patrol read. Selecting a smaller number of pages as the pages to be read can reduce a load on the patrol read. Selecting a larger number of pages as the pages to be read results in a more appropriate learned value by the statistical process. The more appropriate learned value signifies a larger number of readable pages without failure in error correction.

In the patrol read, the controller 200 executes error correction in each of the read operations, and records a success or failure of the error correction (S604). The controller 200 then subjects the results of the error corrections in the read operations to the statistical process.

The controller 200 stores, as a learned value, the value of a shift pattern having resulted in a successful error correction in the patrol read. As described above, the index values indicate ranks corresponding to the degree of variation in the threshold voltage. In the case of an unsuccessful error correction in a read operation in the host read using the learned value (Yes in S705), the controller 200 executes a retry read using a shift pattern with a rank subsequent to the rank of the learned value (S708 and S710).

That is, in the host read, the controller 200 executes a read operation using a learned value and, with a failure of error correction in the read operation, the controller 200 uses, in the retry read, a shift pattern selected upon assuming the situation that the variation in the threshold voltage is more than that at the time of obtaining the learned value. This makes it possible to efficiently search for a shift pattern enabling a read without failure of error correction.

In the above description, the shift patterns are used in order of the shift indices from the one with the shift index of zero in the learned-value generation process. The shift pattern to be used first is not limited thereto. With a recorded learned value available, the shift patterns may be used sequentially from the one with around a shift index indicated by the learned value.

Fourth Embodiment

In a fourth embodiment, a distribution read is executed in the learned-value generation process. The distribution read refers to an operation for acquiring the distribution of the number of memory cells with respect to the threshold voltage. In the distribution read, a plurality of read operations is executed while the determination voltage is varied.

As an example, in the distribution read, a plurality of read operations is executed while one determination voltage is varied by increments of a predetermined value. In each read operation, the number of memory cells in a predetermined state, which is an ON or OFF state, is acquired for each used value of the determination voltage. The distribution of the number of memory cells with respect to the threshold voltage is found by differentiating the number of the memory cells in the predetermined state with respect to the used value of the determination voltage.

After the distribution read, a determination voltage that enables as much reduction as possible in the number of bit errors in the read data is computed.

For example, in FIG. 6, the memory-cell distribution falls to a minimum between states "A" and "B" when the threshold voltage is Vb. Hence, Vb is used as the determination voltage to reduce the occurrence of error such as erroneous read of data programmed "110" as "100", or data programmed "100" as "110".

In the learned-value generation process of the fourth embodiment, for one example, a voltage value, at which the memory-cell distribution with respect to the threshold voltage falls to a minimum between two adjacent states, is computed and learned. A voltage value where the memory-cell distribution with respect to the threshold voltage is minimal between two adjacent states is referred to as an optimal determination voltage. The voltage value to be learned is not limited thereto.

Next, the operation of the memory system 1 of the fourth embodiment is described. An overview of a patrol read of the fourth embodiment is similar to that of the first embodiment illustrated in FIG. 13, therefore, its description is omitted.

Figure 20:
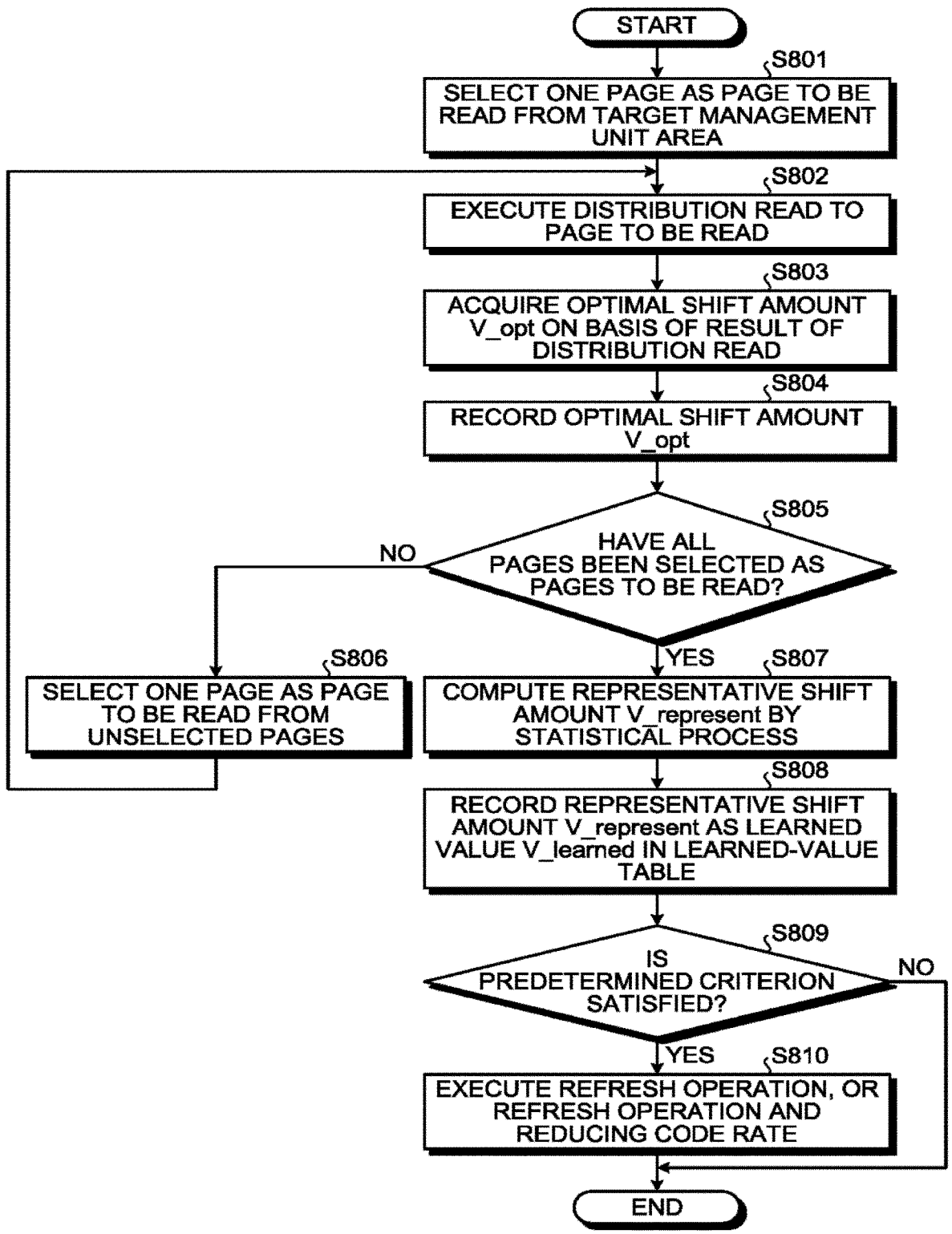
FIG. 20 is a flowchart explaining a learned-value generation procedure of a fourth embodiment.

FIG. 20 is a flowchart explaining a learned-value generation procedure of the fourth embodiment. In the description of FIG. 20, the management unit area 4 as a subject of the learned-value generation process is referred to as a target management unit area 4. In the example of FIG. 20, all the pages of the target management unit area 4 are subjected to a distribution read.

Firstly, the CPU 203 selects one of the pages as a page to be read from the target management unit area 4 (S801). The CPU 203 then executes a distribution read to the page to be read (S802), and acquires an optimal shift amount V_opt from a result of the distribution read (S803).

In S802, for example, the CPU 203 commands the memory chip 101 to perform a read operation multiple times while varying the determination voltage by increments of a predetermined value. In S803, the CPU 203 then generates a memory-cell distribution with respect to the threshold voltage on the basis of read data in each read operation, and computes the optimal shift amount V_opt on the basis of the generated distribution. The optimal shift amount V_opt refers to a shift amount of the optimal determination voltage from a base value of the determination voltage. In S802 and S803, the optimal shift amount V_opt of each of the different determination voltages is acquired.

The access circuit 110 may be configured to be able to execute the distribution read. For example, the CPU 203 commands the memory chip 101 to perform the distribution read. When receiving the distribution read command, the access circuit 110 executes the distribution read, and computes the optimal shift amount V_opt of each of the different determination voltages on the basis of the result of the distribution read. The access circuit 110 then outputs the optimal shift amounts V_opt of the determination voltages to the controller 200. The controller 200 may compute the optimal shift amount V_opt.

After S803, the CPU 203 records the optimal shift amount V_opt of each of the determination voltages (S804). In S804, for example, the CPU 203 records the optimal shift amount V_opt of each of the determination voltages in the RAM 202 in association with the page to be read.

After S804, the CPU 203 determines whether or not all the pages have been selected as the pages to be read from the target management unit area 4 (3805). With unselected pages remaining (No in S805), the CPU 203 selects one of the unselected pages as the page to be read (S806), and re-executes the operation of S802.

Upon selecting all the pages as the pages to be read from the target management unit area 4 (Yes in S805), the CPU 203 subjects the optimal shift amounts V_opt obtained from all the pages to a statistical process to compute a representative shift amount V_represent (S807). In S807, for example, the average of the optimal shift amounts V_opt of all the pages is computed as the representative shift amount V_represent of each of the determination voltages. The statistical process is not limited to this example.

After S807, the CPU 203 records, in the learned-value table 221, the representative shift mount V_represent as a learned value V_learned for the target management unit area 4 (S808). Herein, not an index but a voltage value (shift amount) is recorded in the learned-value table 221. Instead of the voltage value (shift amount), the index of a shift pattern which is defined by a shift amount closest to the voltage value (shift amount) may be recorded in the learned-value table 221. The shift pattern which is defined by the shift amount closest to the voltage value (shift amount) can be identified by any method. For example, the shift pattern which is defined by the shift amount closest to the voltage value (shift amount) is a shift pattern having the least square error. The shift pattern which is defined by the shift amount closest to the voltage value (shift amount) may be identified by minimax. Both of voltage values (shift amount) and indices may be recorded in the learned-value table 221.

Subsequent to S808, the CPU 203 executes operations in S809 and S810 as in S209 and S210, and ends the learned-value generation process.

Figure 21:
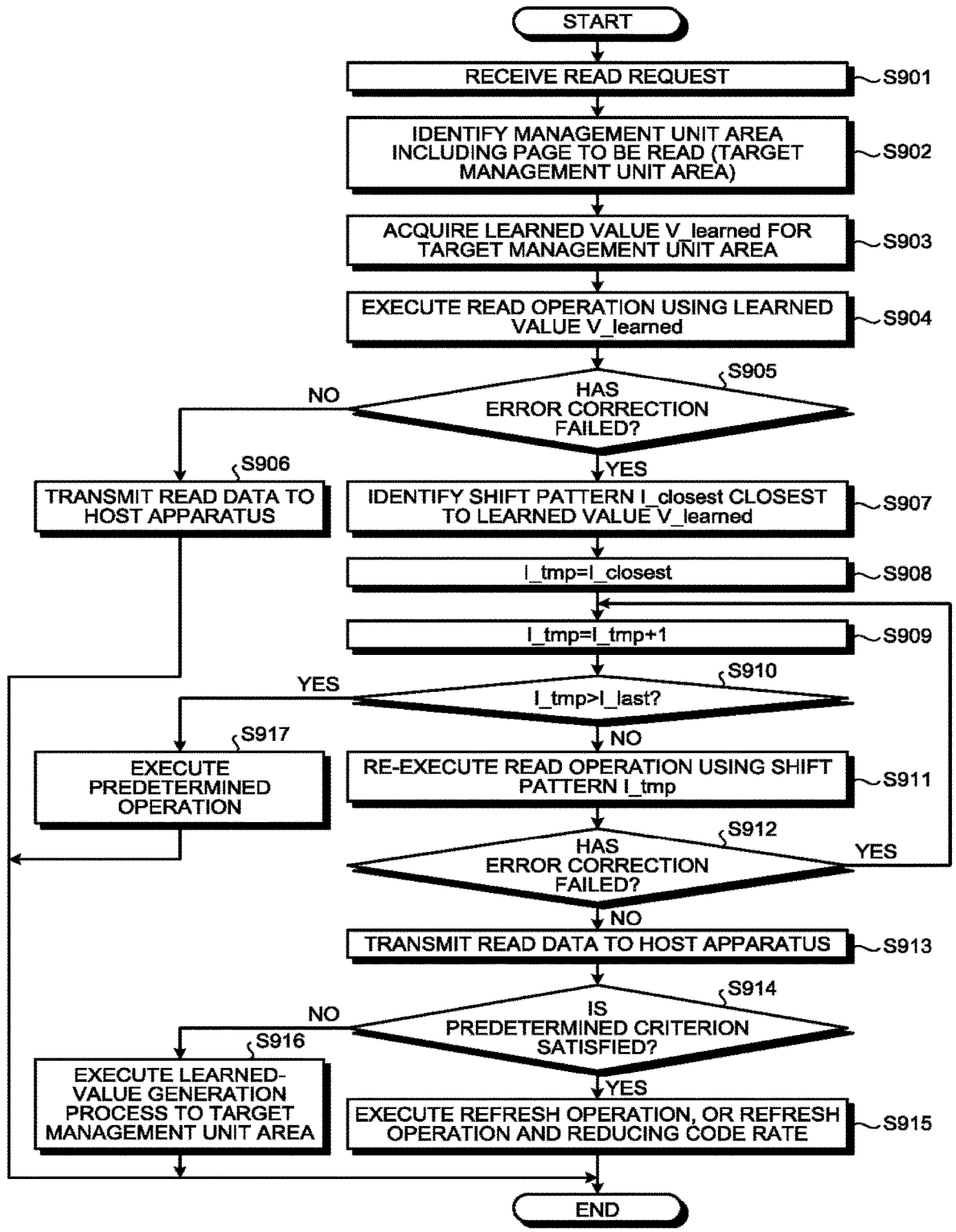
FIG. 21 is a flowchart illustrating a host read procedure of the fourth embodiment.

FIG. 21 is a flowchart illustrating a host read procedure of the fourth embodiment. In the description of FIG. 21, the management unit area 4 including a page to be read is referred to as a target management unit area 4.

When the memory system 1 receives a read request from the host apparatus 300 (S901), the CPU 203 identifies a target management unit area 4 on the basis of the received read request (S902). The CPU 203 then acquires a learned value V_learned for the target management unit area 4 from the learned-value table 221 (S903). The CPU 203 then uses the learned value V_learned to execute a read operation to the page to be read (S904). In S904 the CPU 203 instructs the memory chip 101 about the learned value V_learned as a shift amount from a base value.

By operation of S904, the controller 200 acquires read data. The ECC circuit 206 detects and corrects error in the acquired read data. The CPU 203 determines whether or not the ECC circuit 206 has failed in error correction (S905). Upon determining a success of the error correction (No in S905), the CPU 203 transmits the read data to the host apparatus 300 (S906).

Upon determining a failure of the error correction (Yes in S905), the CPU 203 identifies a shift pattern closest to the learned value V_learned from the shift patterns recorded in the shift index table 220 (S907). The shift pattern closest to the learned value V_learned can be identified by any method such as the least square method or minimax. The index of the identified shift pattern is referred to as I_closest.

The CPU 203 substitutes I_closest into the variable I_tmp (S908), and increments the variable I_tmp by one (S909). The CPU 203 then determines whether or not I_tmp exceeds I_last (S910). With I_tmp not exceeding I_last (No in S910), the CPU 203 uses the shift pattern I_tmp to re-execute a read operation to the page to be read (S911).

By the operation of S911, the controller 200 acquires read data. The ECC circuit 206 detects and corrects error in the acquired read data. The CPU 203 determines whether or not the ECC circuit 206 has failed in the error correction (S912). Upon determining a failure of the error correction (Yes in S912), the CPU 203 re-executes the operation of S909.

Upon determining a success of the error correction (No in S912), the CPU 203 transmits the read data to the host apparatus 300 (S913). In S914 to S916, the CPU 203 executes operations similar to S713 to S715.

With I_tmp exceeding I_last (Yes in S910), the CPU 203 executes a predetermined operation as in S211 (S917), and ends the host read operation.

In the above description, all the pages in the management unit area 4 are selected as the pages to be read. In the patrol read, selection of all the pages of the management unit area 4 as the pages to be read is not always necessary. In the patrol read, a part of the pages (e.g., one or more pages) of the management unit area 4 may be selected as the page(s) to be read. Selecting a smaller number of pages as the pages to be read reduces a load on the patrol read. Selecting a larger number of pages results in a more appropriate learned value by the statistical process. The more appropriate learned value signifies a larger number of readable pages without failure of error correction.

Indices, voltage values (shift amount), or both of them may be recorded in the learned-value table 221.

In the fourth embodiment, thus, in the patrol read the controller 200 executes the distribution read to each of the one or more pages, and acquires the optimal shift amount V_opt for each of the one or more pages (S802 to S806). The controller 200 then executes the statistical process to the optimal shift amounts V_opt for the one or more pages (S807), and computes the representative value V_represent as the learned value. The controller 200 then applies the same learned value to the management unit area 4 in the host read.

Hence, the learned value is acquired by the distribution read, making it possible to reduce the possibility of failure of error correction in the host read. Hence, the deterioration of read latency is reduced.

Fifth Embodiment

The fourth embodiment has described the example of computing the average of the optimal shift amounts V_opt of all the pages as the representative shift amount V_represent for each determination voltage in S807. The method for the statistical process is not limited thereto.

A fifth embodiment will describe an example of another method for the statistical process. In the statistical process of the fifth embodiment, the weighted average of the optimal shift amounts V_opt based on the range of voltage values which enables a read without failure of error correction is computed. The fifth embodiment may be applied to the fourth embodiment.

Figure 22:
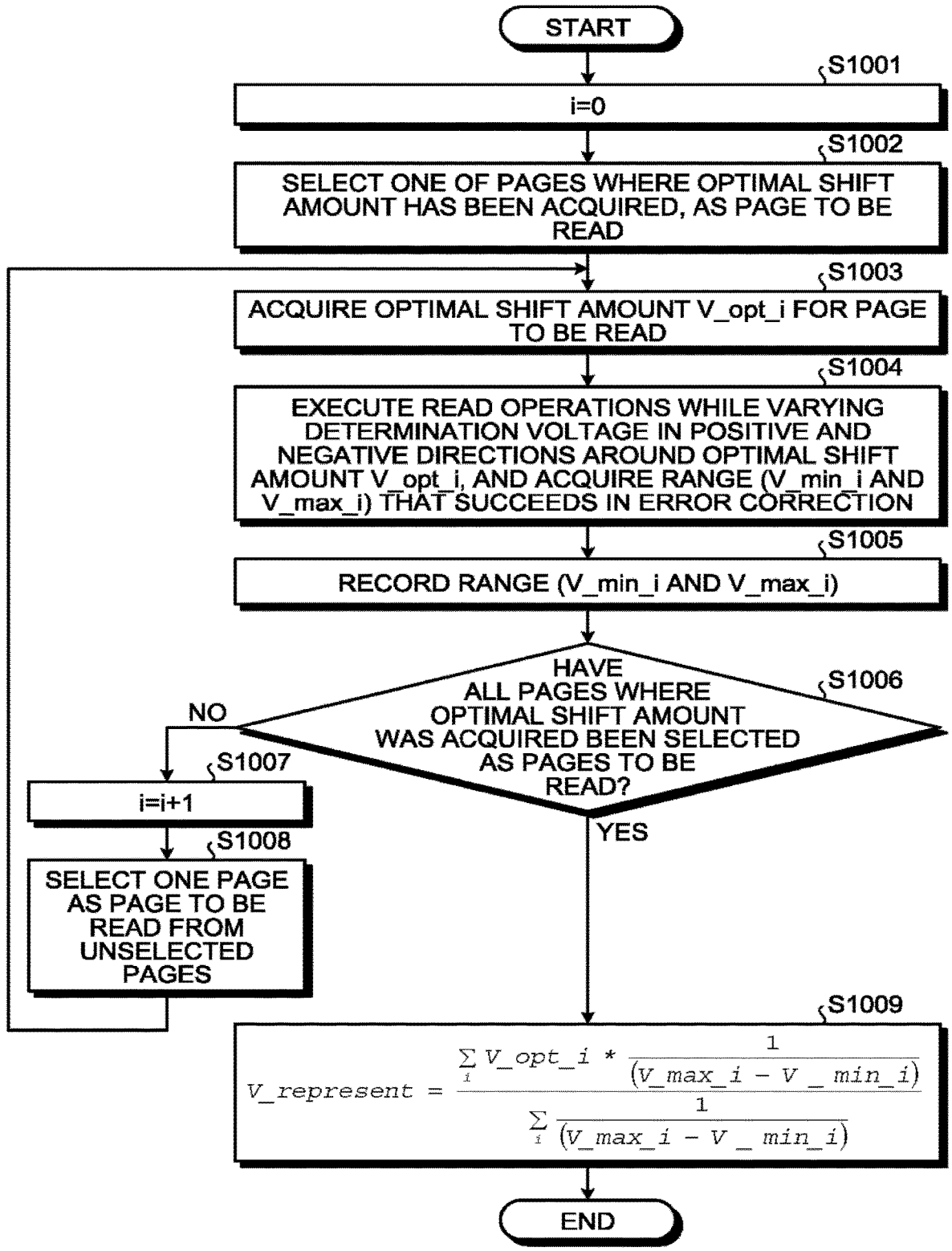
FIG. 22 is a flowchart explaining a method of a statistical process in a fifth embodiment.

FIG. 22 is a flowchart explaining the method for the statistical process of the fifth embodiment.

Firstly, the CPU 203 initializes a variable i to zero (S1001), and selects, as a page to be read, one of the pages from which the optimal shift amount has been acquired (S1002). The CPU 203 then acquires an optimal shift amount (referred to as V_opt_i) for the page to be read (S1003). For example, the CPU 203 acquires the optimal shift amount recorded in S804.

Next, the CPU 203 acquires the range of shift amounts which does not result in failure of error correction (S1004) through a plurality of read operations to the page to be read while varying the determination voltage in positive and negative directions around the optimal shift amount V_opt_i. A minimal value of the range acquired in S1004 is referred to as V_min_i, and a maximal value of the range is referred to as V_max_i.

The CPU 203 records the acquired range (V_min_i and V_max_i) (S1005). For example, the CPU 203 records the range (V_min_i and V_max_i) in the RAM 202 in association with the page to be read.

Next, the CPU 203 determines whether or not all the pages from which the optimal shift amount was acquired have been selected as the pages to be read (S1006). With unselected pages remaining (No in S1006), the CPU 203 increments the variable i by one (S1007). The CPU 203 then selects one of the unselected pages as the page to be read (S1008), and re-executes the operation of S1003.

Upon selecting all the pages from which the optimal shift amount has been acquired (Yes in S1006), the CPU 203 computes, as the representative value V_represent, the average of the optimal shift amounts V_opt_i having a weight of the inverse of the range (V_min_i and V_max_i) (S1009). That is, in S1009 the CPU 203 computes the representative value V_represent by the following equation (1):

$$V\_represent = \frac{\sum_{i} V\_opt\_i * \frac{1}{(V\_max\_i - V\_min\_i)}}{\sum_{i} \frac{1}{(V\_max\_i - V\_min\_i)}} \qquad (1)$$

The operation of S1009 is executed for each of the determination voltages.

The statistical process of the fifth embodiment ends in S1009.

According to the fifth embodiment, thus, in the statistical process the controller 200 computes the weighted average of the optimal shift amounts V_opt based on the range of voltage values which enables a read without failure of error correction. The narrower the range of voltage values enabling a read of a page without failure of error correction is, the larger the weighting factor the page is given. Thereby, it is possible to learn voltage values at which as many pages as possible in the management unit area 4 can be read without failure of error correction.

Sixth Embodiment

A sixth embodiment describes still another example of the statistical process. In the statistical process in the sixth embodiment, the weighted average of the optimal shift amounts V_opt_i is computed using the number of bit errors detected in a read operation. The statistical process of the sixth embodiment may be applied to the fourth embodiment.

Figure 23:
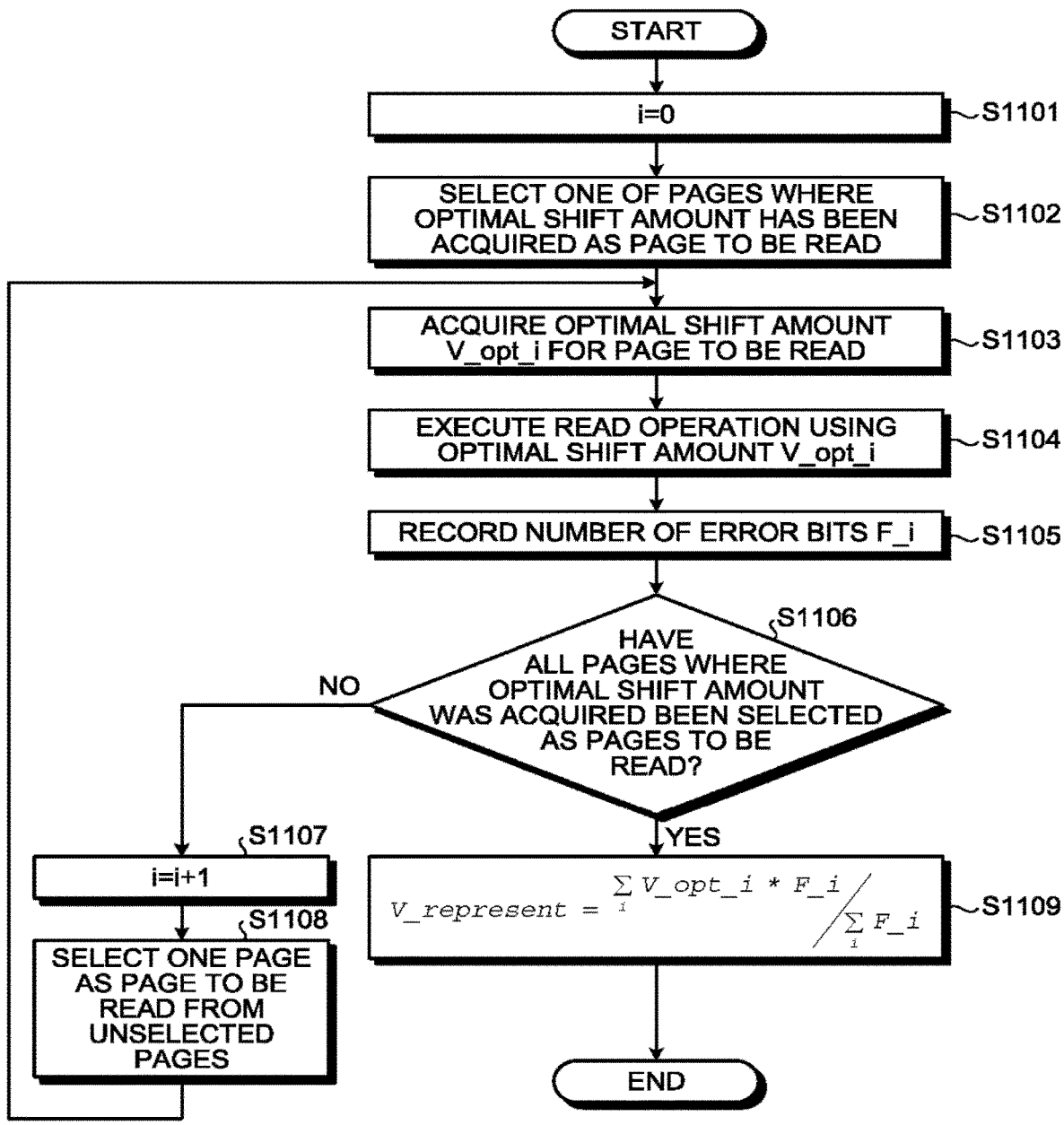
FIG. 23 is a flowchart explaining a method of a statistical process in a sixth embodiment.

FIG. 23 is a flowchart explaining a method for the statistical process of the sixth embodiment.

Firstly, the CPU 203 initializes the variable i to zero (S1101), and selects, as a page to be read, one of the pages from which the optimal shift amount has been acquired (S1102). The CPU 203 then acquires an optimal shift amount (referred to as V_opt_i) for the page to be read (S1103). For example, the CPU 203 acquires the optimal shift amount recorded in S804.

The CPU 203 then uses the optimal shift amount V_opt_i to execute a read operation to the page to be read (S1104). By the operation of S1104, the controller 200 acquires read data. The ECC circuit 206 detects error in the acquired read data. The CPU 203 acquires the number of detected bit errors (referred to as F_i) from the ECC circuit 206, and records the acquired number of bit errors F_i (S1105). For example, the CPU 203 records the number of bit errors F_i in the RAM 202 in association with the page to be read.

Next, the CPU 203 determines whether or not all the pages where the optimal shift amount was acquired have been selected as the pages to be read (S1106). With unselected pages remaining (No in S1106), the CPU 203 increments the variable i by one (S1107). The CPU 203 then selects one of the unselected pages as the read page (S1108), and re-executes the operation of S1103.

Upon selecting all the pages from which the optimal shift amount has been acquired (Yes in S1106), the CPU 203 computes, as the representative value V_represent, the weighted average of the optimal shift amounts V_opt_i based on the number of bit errors F_i (S1109). In other words, in S1109, the CPU 203 computes the representative value V_represent by the following equation (2):

$$V\_represent = \frac{\sum_{i} V\_opt\_i * F\_i}{\sum_{i} F\_i} \qquad (2)$$

The operation of S1109 is executed for each of the determination voltages.

The statistical process of the sixth embodiment ends in S1109.

A larger number of bit errors F resulting from the optimal shift amount V_opt signifies a narrower range of voltage values which enables a read without failure of error correction. According to the sixth embodiment, in the statistical process the controller 200 computes the weighted average on the basis of the number of bit errors detected in a read operation. This enables learning of voltage values at which as many pages as possible in the management unit area 4 can be read without failure of error correction, as with the fifth embodiment.

Seventh Embodiment

The first embodiment has described an example of the method for setting the management unit areas 4, that is, equally dividing the group 2 into 16 subgroups 3 to set the management unit areas 4 including different types of pages in each subgroup 3. The method for setting the management unit areas 4 is not limited to this example.

For example, the number of subgroups 3 created from the group 2 is not limited to sixteen. The group 2 may be divided into, for example, two, four, eight, or 64 subgroups 3.

Figure 24:
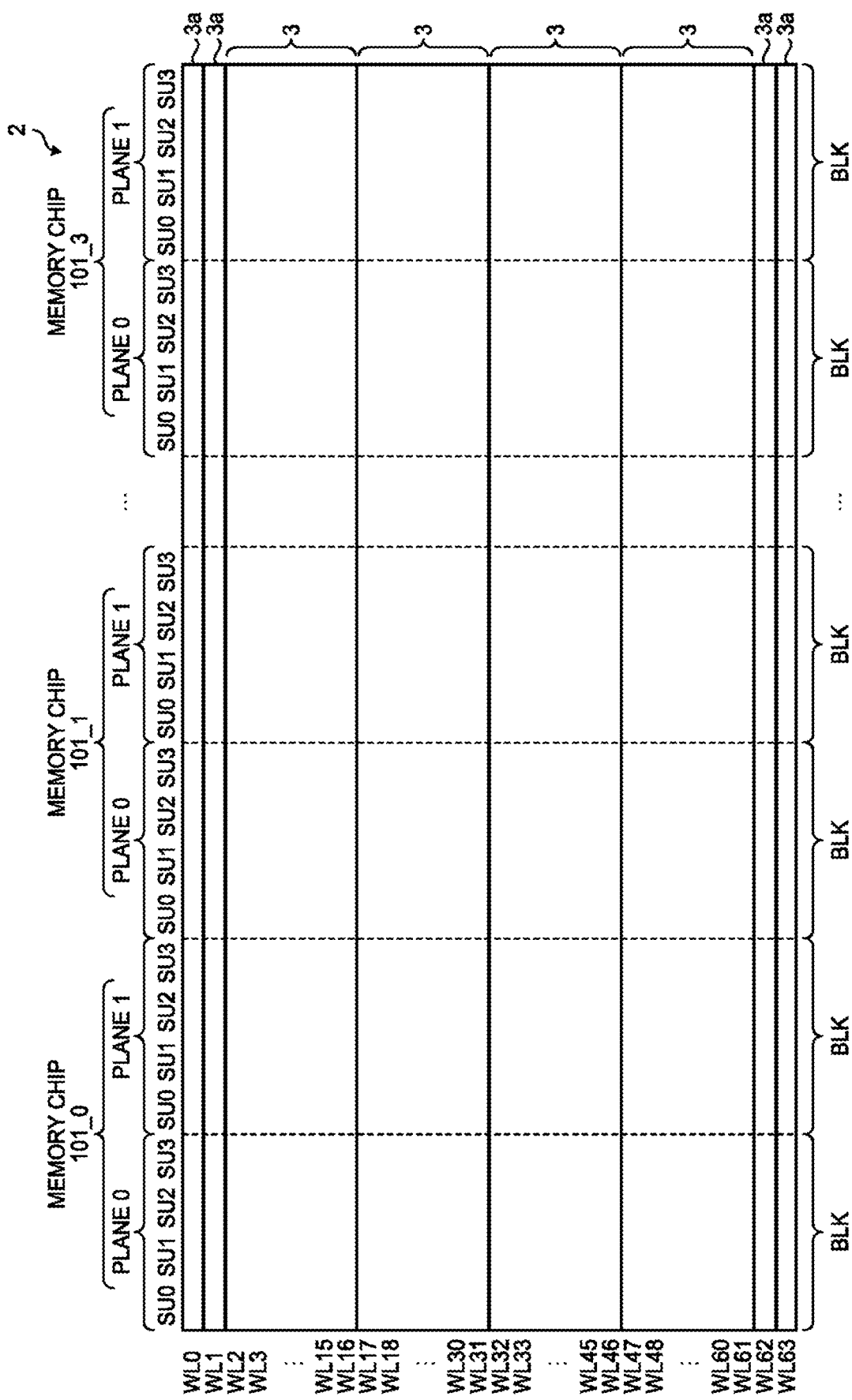
FIG. 24 is a diagram for explaining a method for setting management unit areas in a seventh embodiment.

For another example, the group 2 can be unequally divided into a plurality of subgroups 3. FIG. 24 is a diagram illustrating another method for dividing the group 2. As illustrated in FIG. 24, the group 2 is divided into four subgroups 3a including one word line, and four subgroups 3b including fifteen word lines in a direction in which the word lines are arranged. Two subgroups 3a are located at both ends of the NAND string 114. In other words, the group 2 is unequally divided into a plurality of subgroups 3 in the direction in which the word lines are arranged.

In the NAND flash memory having the structure illustrated in FIGS. 3 and 4, the threshold-voltage variation characteristics of memory cells located in the vicinity of the ends of the NAND string 114 might be greatly different from those of memory cells located in the center of the NAND string 114. Hence, if the same management unit area 4 includes the memory cells located both in the center and in the vicinity of the end of the NAND string 114, it is difficult to read all the data from the management unit area 4 with one learned value without failure of error correction. In contrast, in the example of FIG. 24, the granularity of division is different between the vicinity of both ends and the center of the NAND string 114. Specifically, the granularity of division is larger in the vicinity of both ends of the NAND string 114 than in the center of the NAND string 114. By setting the subgroups 3 at a larger granularity in the vicinity of the ends of the NAND string 114, thus, memory cells having a specific characteristic can be included in an independent management unit area 4 for management. This can further reduce the possibility of failure of error correction in the whole group 2.

For still another example, each block BLK may be set as one subgroup 3.

In each of the above-mentioned examples, the different management unit areas 4 are set in each of the pages of each subgroup 3. One management unit area 4 may be made of a memory area including a plurality of pages of each subgroup 3. In other words, the same learned value (for example, a learned shift pattern) may be applied to one subgroup 3 irrespective of the type of a page.

Moreover, a plurality of tiers (Tier) may be stacked in a D3 direction. Each tier has the structure illustrated in FIG. 4. If the memory cell array 111 is configured to include stacked tiers, the learned-value table 221 may be provided for each tier, or one learned-value table 221 may be shared among the tiers. For example, if the tiers significantly differ in the threshold-voltage variation characteristic, the learned-value table 221 is provided for each tier. If the tiers has a similar threshold-voltage variation characteristic, the same learned-value table 221 is used for the tiers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
   a first memory that is nonvolatile and includes a memory cell transistor configured to have a threshold voltage to be controlled;
   a controller configured to execute a read operation to the first memory to acquire, from the first memory, data corresponding to the threshold voltage on the basis of a comparison between the threshold voltage and a determination voltage; and
   a second memory configured to store determination voltage information including a plurality of candidate values, each of the candidate values being ranked corresponding to a degree of variation in the threshold voltage, wherein
   the controller is configured to:
      execute a plurality of first read operations to the first memory, the plurality of first read operations being read operations that are executed using, as the determination voltage, different candidate values among the plurality of candidate values;
      execute error correction to acquired data in each of the first read operations; and
      acquire a first candidate value on the basis of results of the error correction in the first read operations; and, upon receiving a read request from the host, execute a second read operation, the second read operation being a read operation that is executed using, as the determination voltage, a second candidate value that is ranked higher than the first candidate value.

2. The memory system according to claim 1, wherein, upon receiving the read request from the host, the controller executes the second read operation first, and executes error correction to data acquired by the second read operation, and upon failure of the error correction to the data acquired by the second read operation, executes a third read operation, wherein
   the third read operation is a read operation that is executed using, as the determination voltage, a third candidate value that is ranked lower than the second candidate value.

3. The memory system according to claim 1, wherein, upon receiving the read request from the host, the controller executes a third read operation first, and executes error correction to data acquired by the third read operation, and upon failure of the error correction to the data acquired by the third read operation, executes the second read operation, wherein
   the third read operation is a read operation that is executed using the first candidate value as the determination voltage.

4. The memory system according to claim 1, wherein
   the first memory includes a plurality of first memory cell transistors including the memory cell transistor,
   the first memory includes a plurality of first memory areas,
   each of the first memory areas includes a plurality of second memory cell transistors among the first memory cell transistors, and
   the controller executes the first read operations to one of the first memory areas, acquires the first candidate value, and applies the second candidate value in common to the first memory areas.

5. The memory system according to claim 4, wherein
   the first memory includes a plurality of NAND strings and a plurality of word lines crossing to the plurality of NAND strings,
   the first memory includes a plurality of third memory areas each including the plurality of first memory areas,
   the third memory areas are arranged in a direction in which the plurality of word lines are arranged, and
   the plurality of third memory areas includes a fourth memory area including a first number of the first memory areas, and a fifth memory area including a second number of the first memory areas, the second number being different from the first number.

6. The memory system according to claim 5, wherein
   the first number is less than the second number, and the fourth memory area is located closer to an end of the plurality of NAND strings than the fifth memory area.

7. The memory system according to claim 1, wherein the first candidate value is the determination voltage that has been applied in a first read operation where the error correction has been successful, among the first read operations.

8. The memory system according to claim 1, wherein
   the first read operations are read operations that are executed using the candidate values as the determination voltages in order of ranks set for the candidate values, and
   the first candidate value is the determination voltage that has been used in a first read operation where the error correction has been successful among the first read operations.

9. A memory system connectable to a host, the memory system comprising:
   a nonvolatile memory including a memory cell transistor configured to have a threshold voltage to be controlled; and a controller configured to execute a read operation to the nonvolatile memory to acquire data corresponding to the threshold voltage from the nonvolatile memory on the basis of a comparison between the threshold voltage and a determination voltage, wherein the controller is configured to:
  execute a plurality of first read operations to the nonvolatile memory, the plurality of first read operations being read operations that are executed using different first voltage values as the determination voltage;
  compute a second voltage value by a statistical process based on results of the first read operations; and,
  upon receiving a read request from the host, execute a second read operation to the nonvolatile memory, the second read operation being a read operation that is executed using the second voltage value as the determination voltage.

10. The memory system according to claim 9, wherein
the nonvolatile memory includes a plurality of first memory cell transistors including the memory cell transistor,
the nonvolatile memory includes a plurality of first memory areas, the first memory areas each being a unit of execution of a read operation,
each of the first memory areas includes a plurality of second memory cell transistors among the plurality of first memory cell transistors,
the plurality of first memory areas includes one or more second memory areas,
the controller executes the first read operations to each of the one or more second memory areas, and computes the second voltage value by executing the statistical process to results of the first read operations to each of the one or more second memory areas, and
the second voltage value is applied in common to the plurality of first memory areas.

11. The memory system according to claim 10, wherein
the nonvolatile memory includes a plurality of NAND strings and a plurality of word lines crossing to the plurality of NAND strings,
the nonvolatile memory includes a plurality of third memory areas each including the plurality of first memory areas,
the third memory areas are arranged in a direction in which the plurality of word lines are arranged, and
the plurality of third memory areas includes a fourth memory area including a first number of the first memory areas, and a fifth memory area including a second number of the first memory areas, the second number being different form the first number.

12. The memory system according to claim 11, wherein
the first number is less than the second number, and the fourth memory area is located closer to an end of the plurality of NAND strings than the fifth memory area.

13. The memory system according to claim 9, wherein the controller executes error correction to acquired data in each of the first read operations, and computes the second voltage value by executing the statistical process to results of the error corrections in the first read operations, the results indicating a success or failure of the error corrections.

14. The memory system according to claim 13, wherein
each of the first voltage values is assigned with a rank corresponding to a degree of variation in the threshold voltage,
the controller acquires one of the first voltage values as the second voltage value by the statistical process, executes error correction to data acquired by the second read operation, and upon failure of the error correction, executes a third read operation, and
the third read operation is a read operation using one of the first voltage values, the one of the first voltage value having a higher rank than a rank of the second voltage value, the higher rank corresponding to a further degree of the variation in the threshold voltage.

15. The memory system according to claim 9, wherein
the nonvolatile memory includes a plurality of first memory cell transistors including the memory cell transistor,
the nonvolatile memory includes a plurality of first memory areas,
each of the first memory areas includes a plurality of second memory cell transistors among the plurality of first memory cell transistors,
the plurality of first memory areas includes one or more second memory areas,
the first read operations are operations for measuring a distribution of a number of memory cell transistors with respect to threshold voltages and acquiring a candidate value for the determination voltage on the basis of a measurement result,
the controller executes the first read operations to each of the one or more second memory areas, and computes the second voltage value by executing the statistical process to candidate values for the one or more second memory areas, and
the second voltage value is applied in common to the plurality of first memory areas.

16. The memory system according to claim 15, wherein the controller acquires a range of a voltage value that enables a read without failure of error correction for each of the one or more second memory areas, and executes weighting based on the range in the statistical process.

17. The memory system according to claim 15, wherein the controller executes a third read operation to each of the one or more second memory areas, and executes weighting on the basis of a number of error bits in the statistical process, the third read operation being an operation for counting the number of error bits in data acquired by a read operation using a corresponding candidate value.

18. The memory system according to claim 1, wherein a first degree of variation in the threshold voltage is larger than a second degree of variation in the threshold voltage, the first degree corresponding to the first candidate value, the second degree corresponding to the second candidate value.

* * * * *